(12) United States Patent
Tsai et al.

(10) Patent No.: US 12,040,409 B2
(45) Date of Patent: Jul. 16, 2024

(54) THIN FILM TRANSISTOR INCLUDING A DIELECTRIC DIFFUSION BARRIER AND METHODS FOR FORMING THE SAME

(71) Applicant: Taiwan Semiconductor Manufacturing Company Limited, Hsinchu (TW)

(72) Inventors: Wu-Wei Tsai, Hsinchu (TW); Hai-Ching Chen, Hsinchu (TW); Sai-Hooi Yeong, Zhubei (TW); Yu-Ming Lin, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 235 days.

(21) Appl. No.: 17/467,492

(22) Filed: Sep. 7, 2021

(65) Prior Publication Data

US 2022/0254931 A1     Aug. 11, 2022

Related U.S. Application Data

(60) Provisional application No. 63/147,252, filed on Feb. 9, 2021.

(51) Int. Cl.
| | |
|---|---|
| *H01L 29/66* | (2006.01) |
| *H01L 23/528* | (2006.01) |
| *H01L 27/12* | (2006.01) |
| *H01L 29/786* | (2006.01) |

(52) U.S. Cl.
CPC ...... *H01L 29/7869* (2013.01); *H01L 23/5283* (2013.01); *H01L 27/1207* (2013.01); *H01L 29/66772* (2013.01); *H01L 29/78654* (2013.01)

(58) Field of Classification Search
CPC . H01L 23/5283; H01L 23/532; H01L 23/535; H01L 27/1207; H01L 27/12;
(Continued)

(56) References Cited

U.S. PATENT DOCUMENTS 10,504,925 B2 * 12/2019 Yamazaki ......... H01L 29/66969
2015/0001533 A1    1/2015 Kuwabara et al.
(Continued)

FOREIGN PATENT DOCUMENTS

| KR | 19980063491 A | 10/1998 |
|---|---|---|
| KR | 20160116894 A | 10/2016 |

(Continued)

OTHER PUBLICATIONS

Korean Patent and Trademark Office; Application No. 10-2022-0016290; First Office Action mailed Feb. 21, 2024, 18 pages.
(Continued)

*Primary Examiner* — Nikolay K Yushin
(74) *Attorney, Agent, or Firm* — The Marbury Law Group, PLLC

(57) ABSTRACT

A semiconductor device includes an insulating layer embedding a gate electrode and overlying a substrate, a stack of a gate dielectric including a gate dielectric material, a dielectric diffusion barrier liner including a dielectric diffusion barrier material, and an active layer overlying a top surface of the gate electrode, and
a source electrode and a drain electrode contacting a respective portion of a top surface of the active layer. The dielectric diffusion barrier material is different from the gate dielectric material and is selected from a dielectric metal oxide material and a dielectric compound of silicon, and suppresses loss of metallic elements during subsequent anneal processes.

20 Claims, 27 Drawing Sheets

(58) Field of Classification Search
CPC ... H01L 27/0688; H01L 27/06; H01L 27/088;
H01L 27/092; H01L 29/7869; H01L
29/66772; H01L 29/78654; H01L 29/786;
H01L 29/423; H01L 29/42384; H01L
29/42324; H01L 29/4234; H01L
29/42364; H01L 29/66742; H01L 29/66;
H01L 29/66969; H01L 29/78696; H01L
23/528; H01L 23/367; H01L 23/5226;
H01L 27/0922
See application file for complete search history.

(56) References Cited

U.S. PATENT DOCUMENTS

| | | | | |
|---|---|---|---|---|
| 2018/0040641 | A1* | 2/2018 | Yamazaki | ............. H01L 21/467 |
| 2023/0047805 | A1 | 2/2023 | Hodo et al. | |

FOREIGN PATENT DOCUMENTS

| | | |
|---|---|---|
| KR | 20200036951 A | 4/2020 |
| KR | 20200119119 A | 10/2020 |
| WO | 2018186835 A1 | 10/2018 |
| WO | 2021144666 A1 | 7/2021 |

OTHER PUBLICATIONS

German Patent and Trademark Office; Application No. 10-2022-100347.7; First Examination Report mailed Apr. 12, 2024, 16 pages.

\* cited by examiner

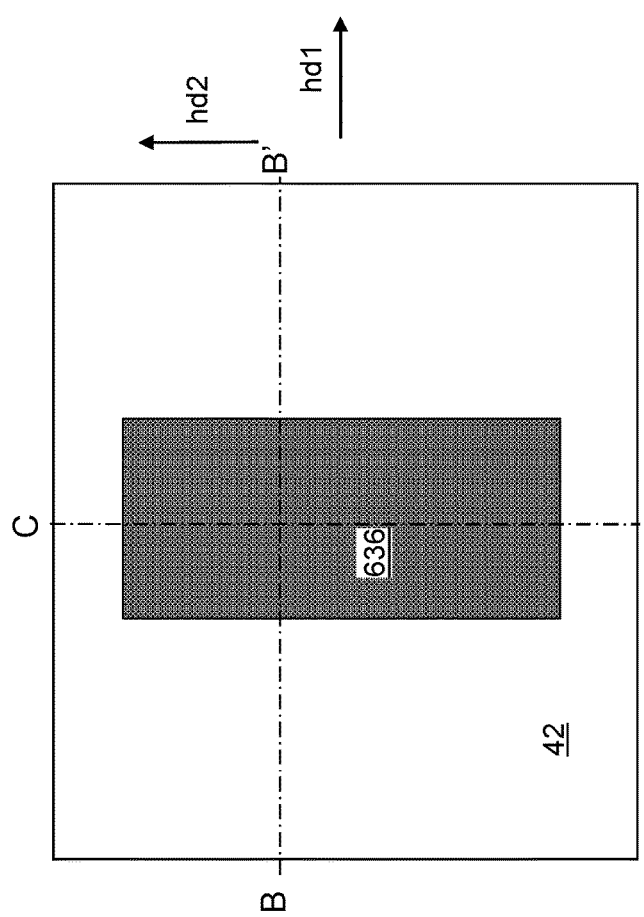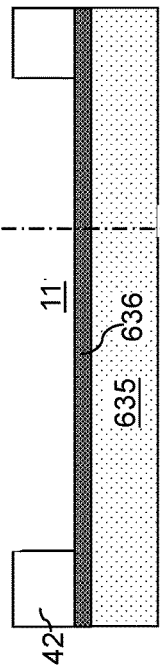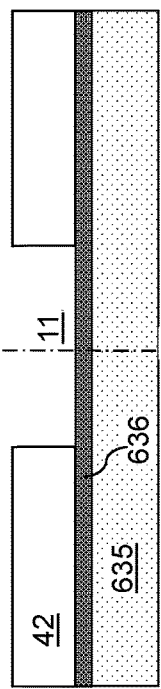

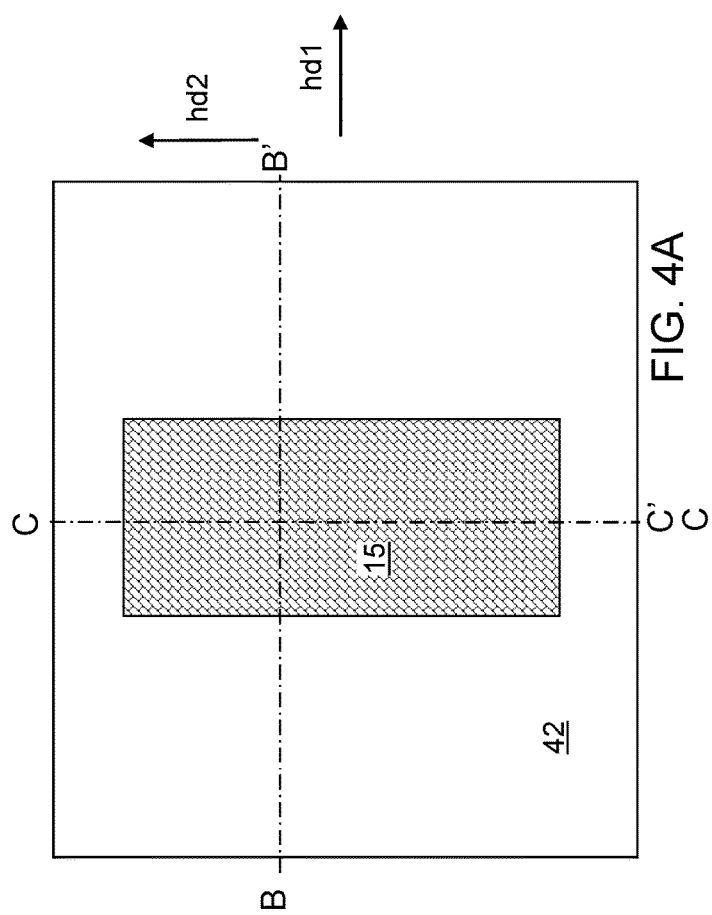
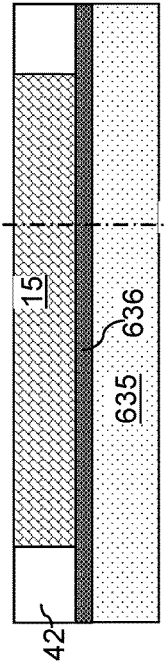
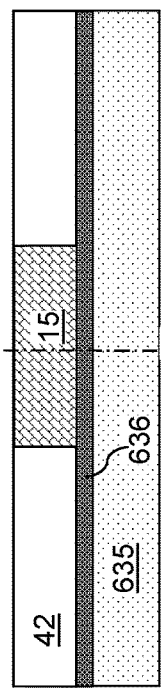
FIG. 4A
FIG. 4B
FIG. 4C

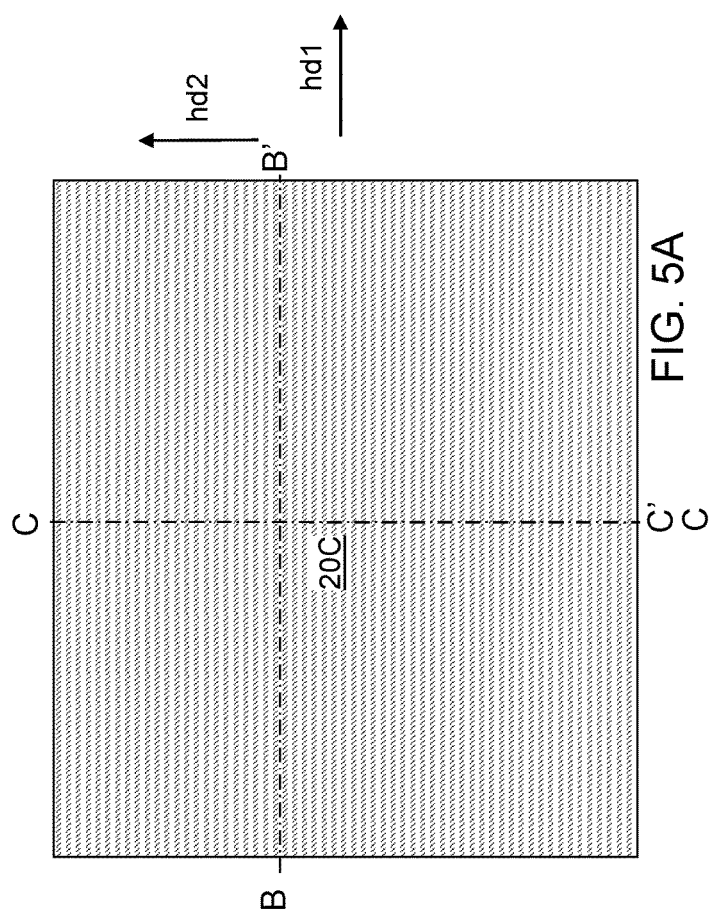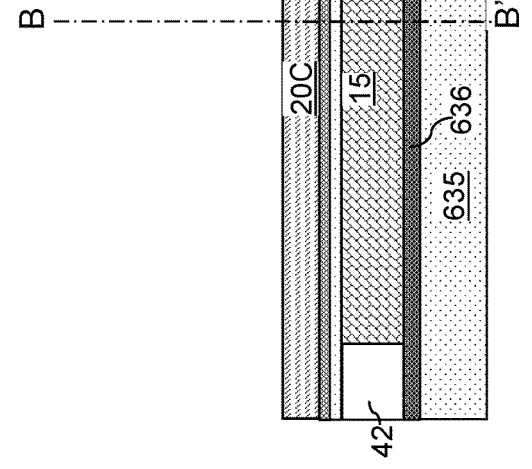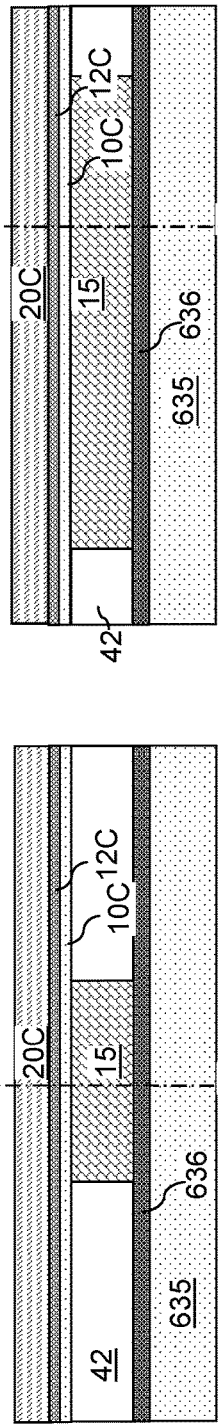

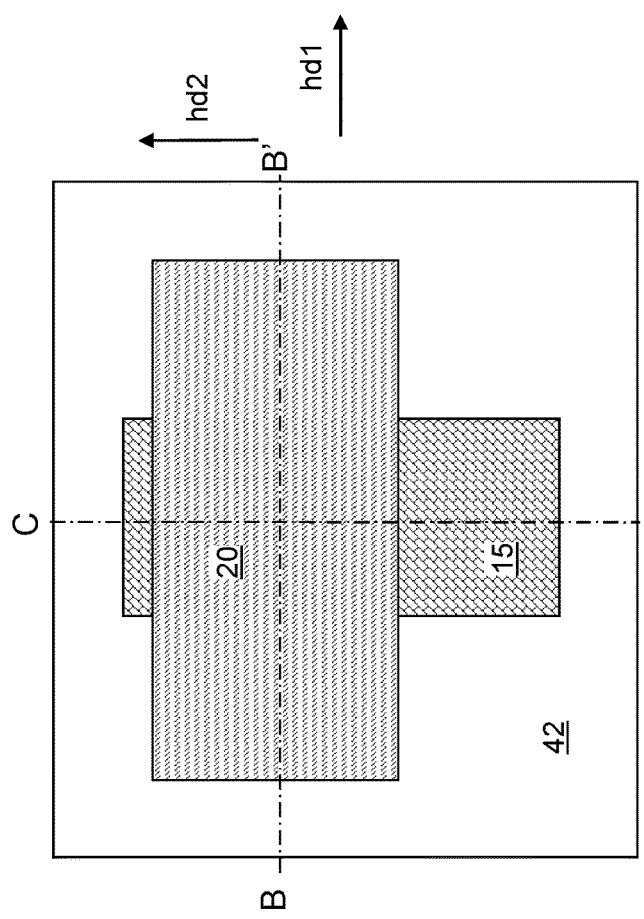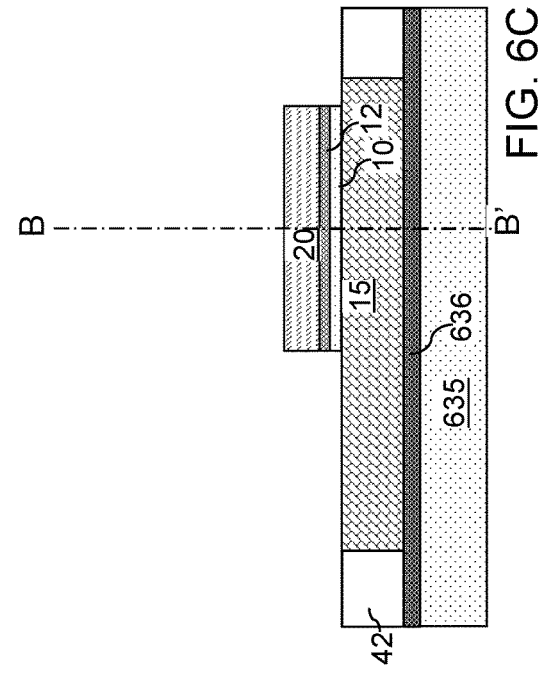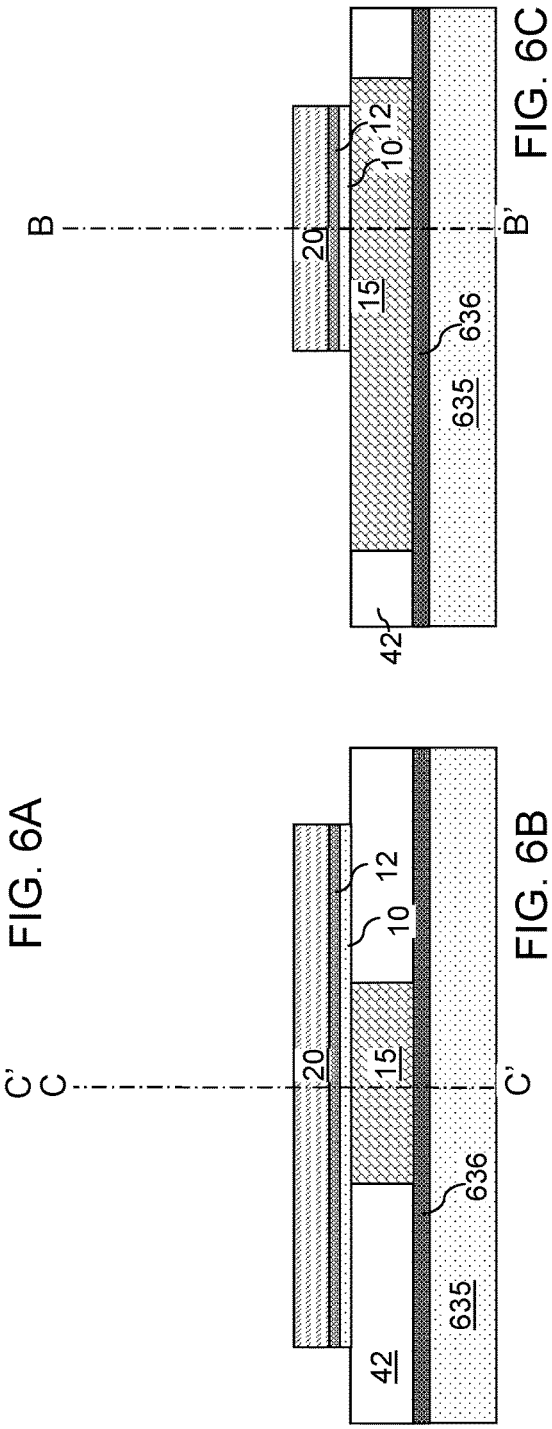

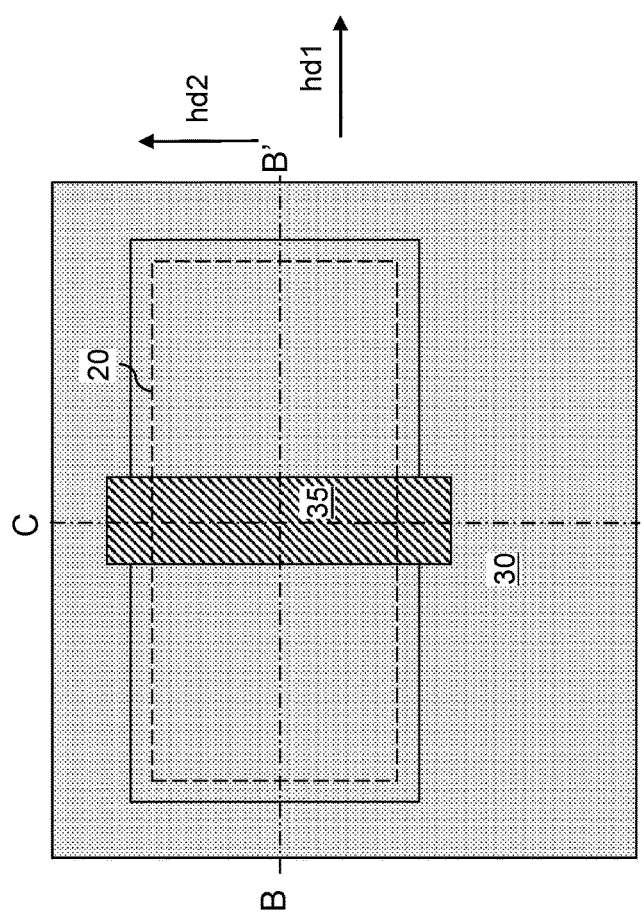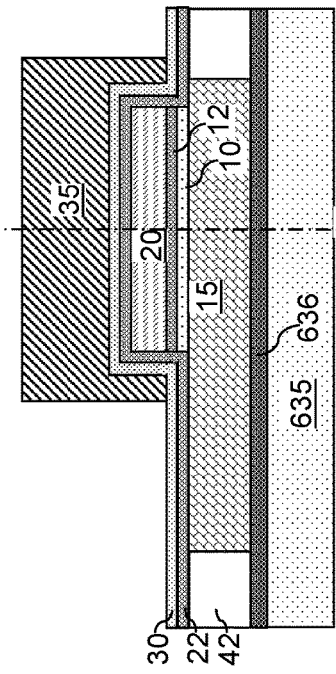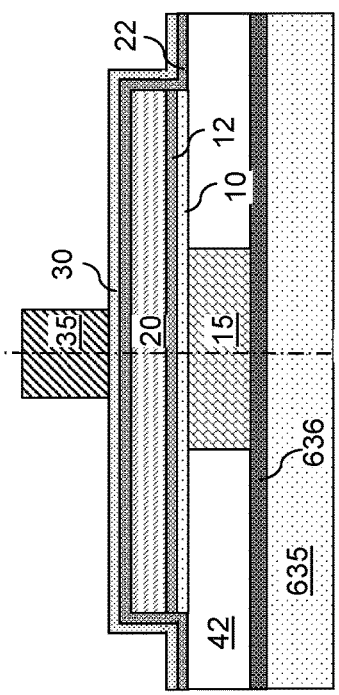

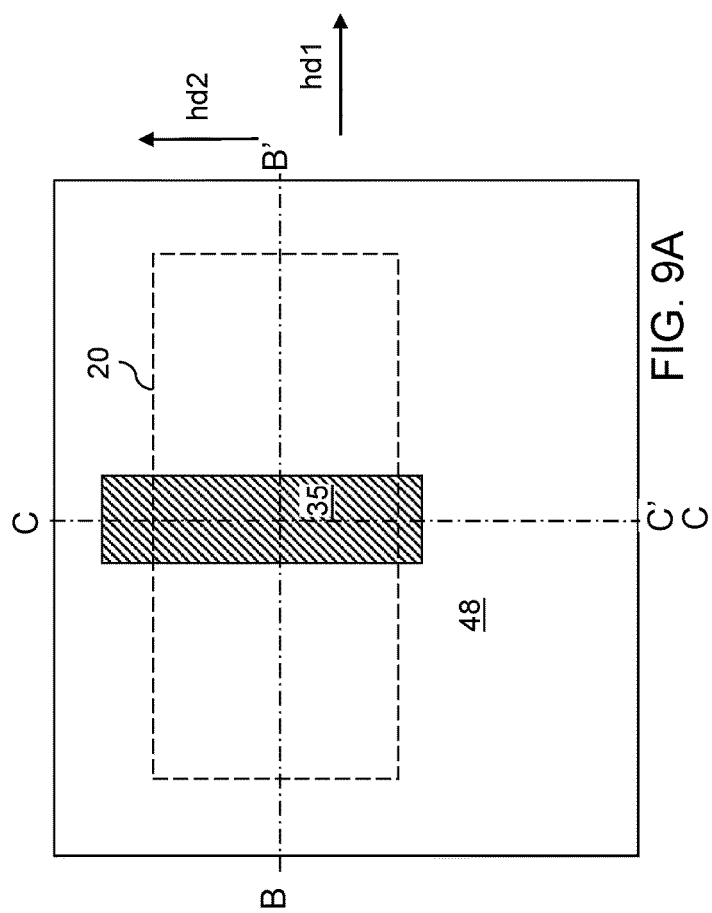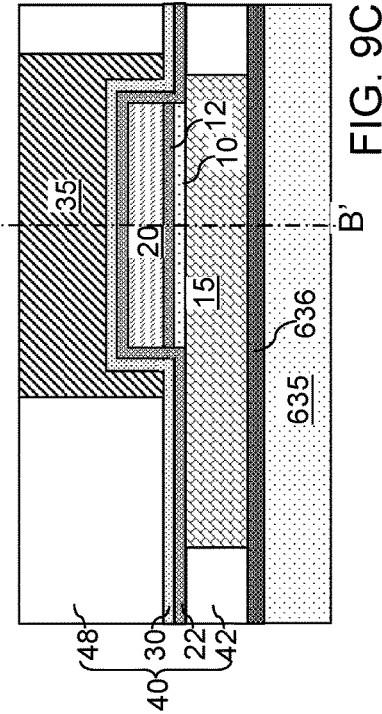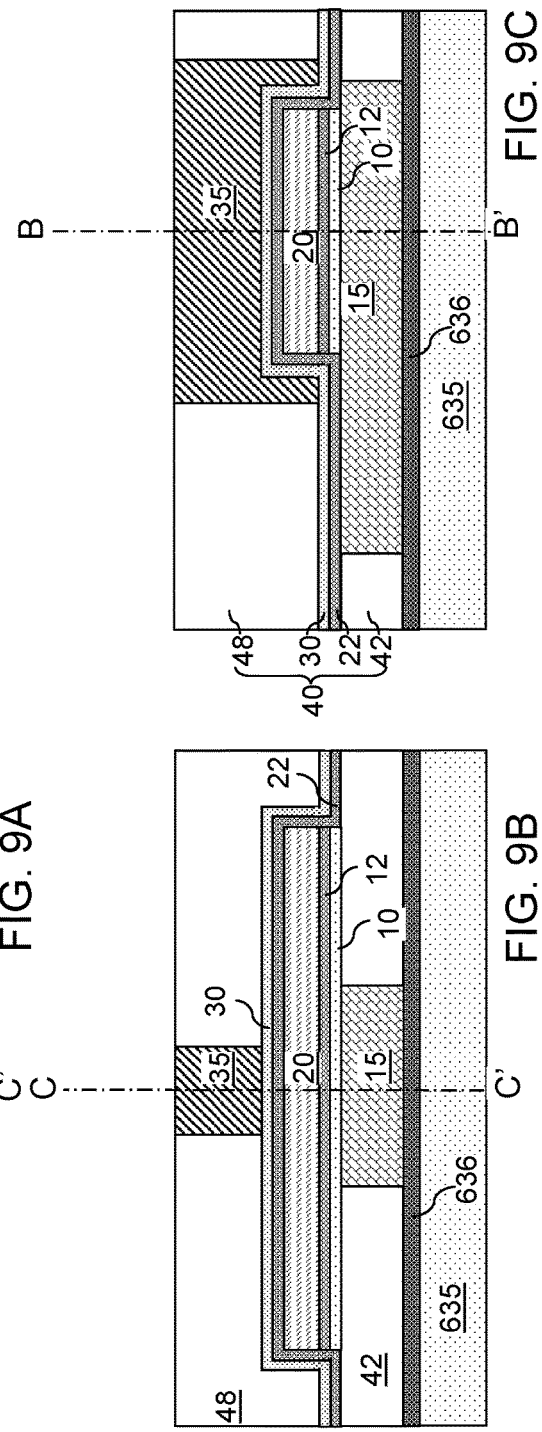

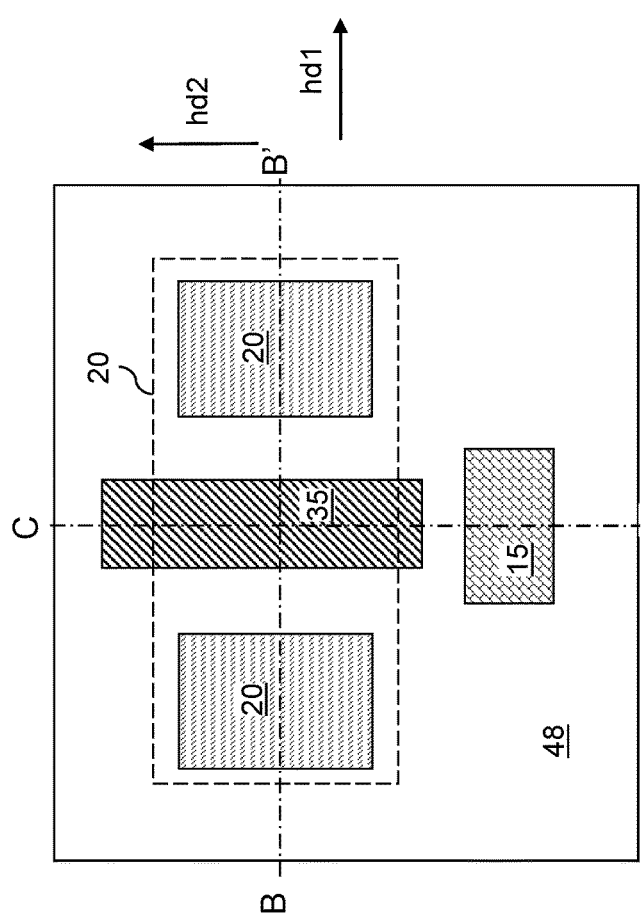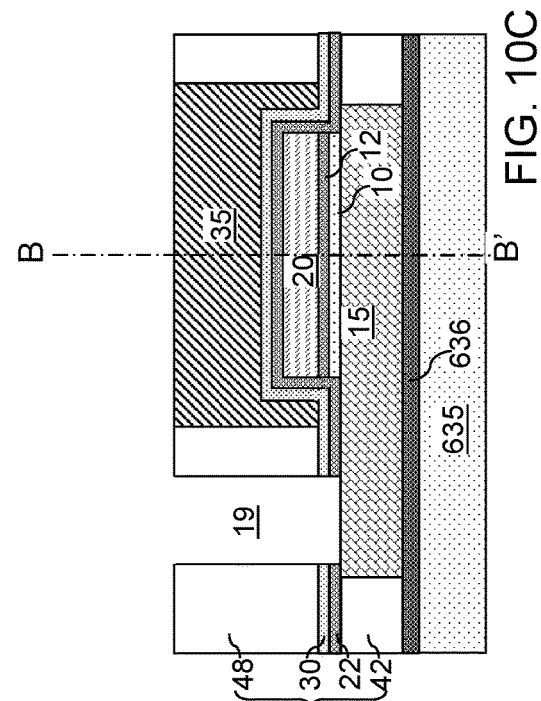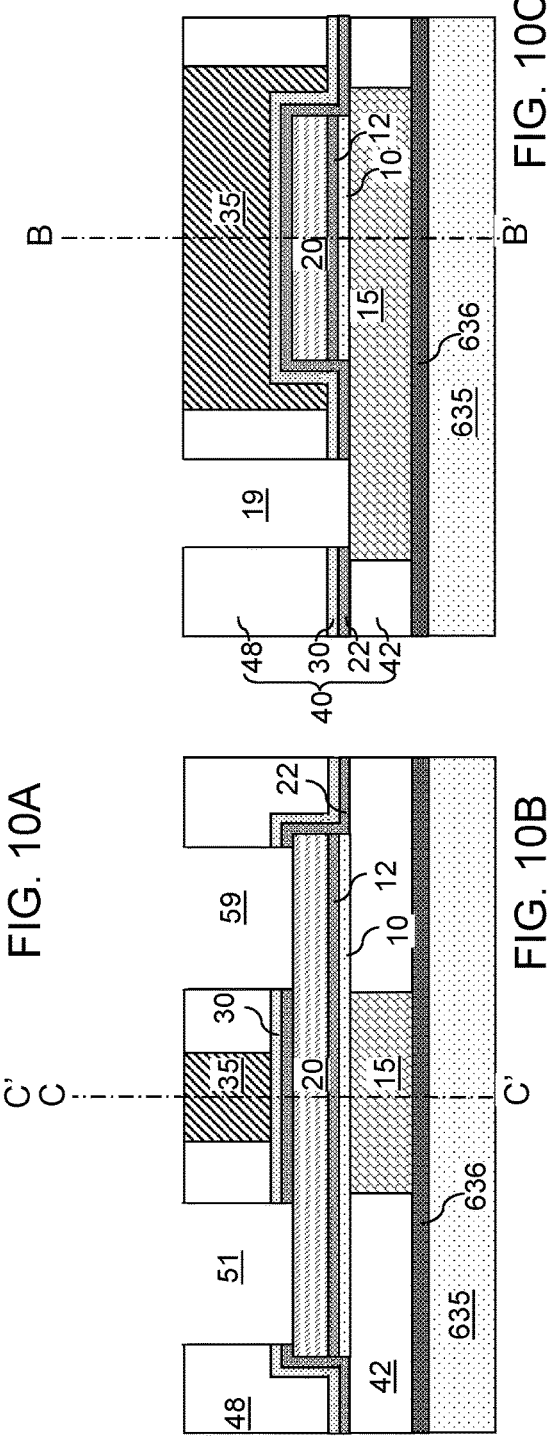

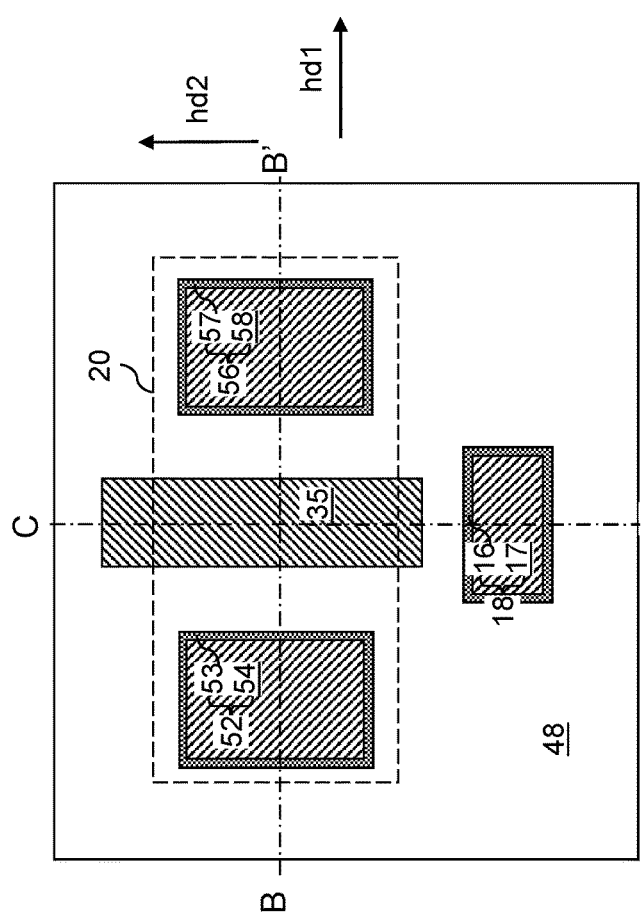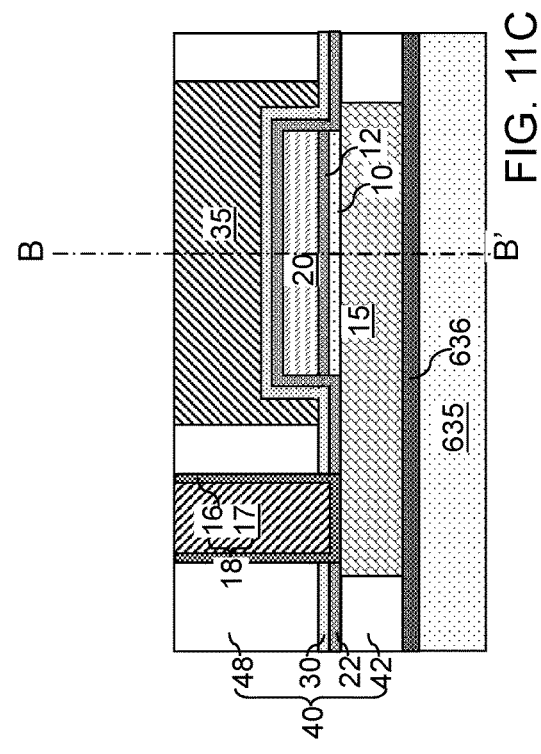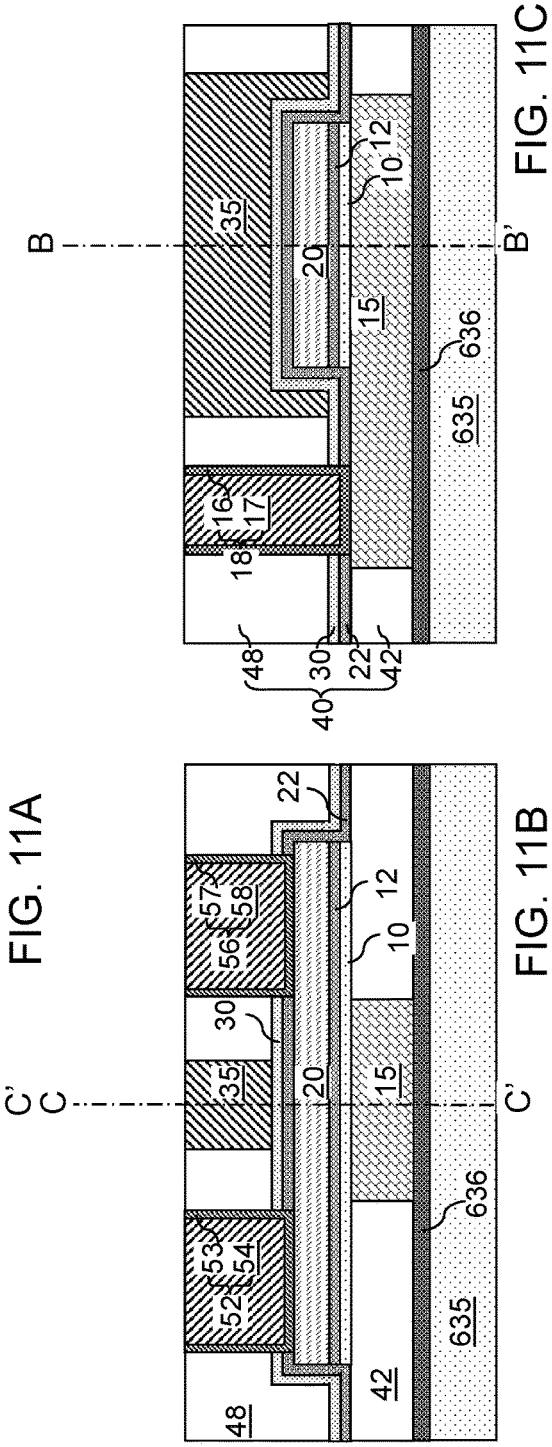

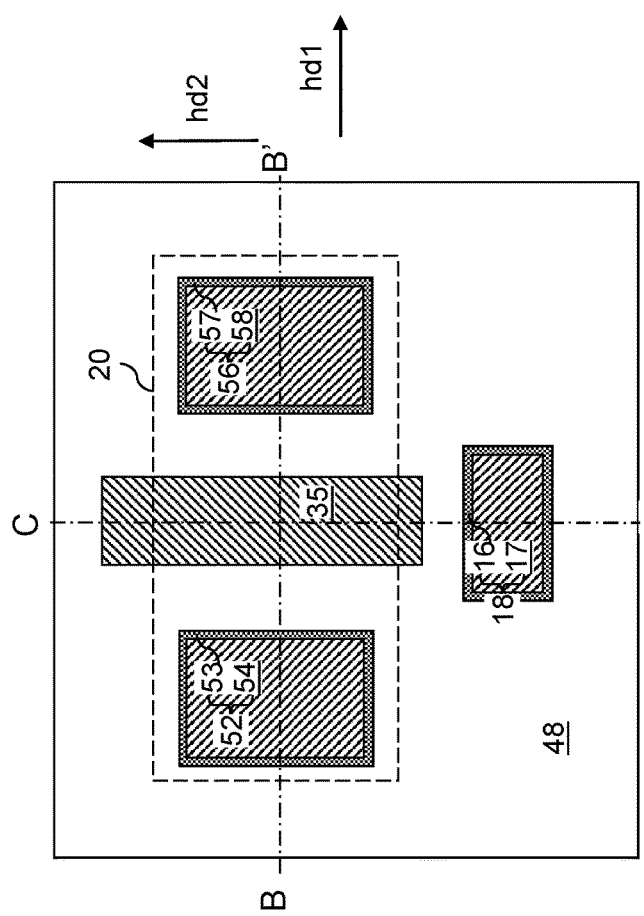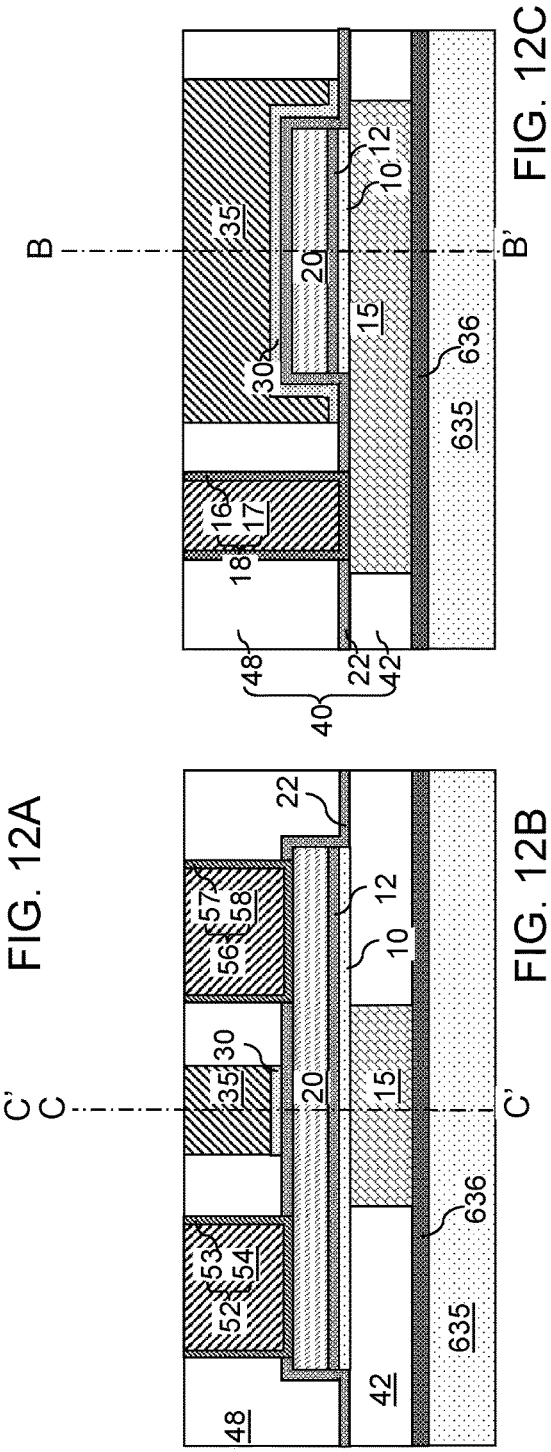
FIG. 12A
FIG. 12B
FIG. 12C

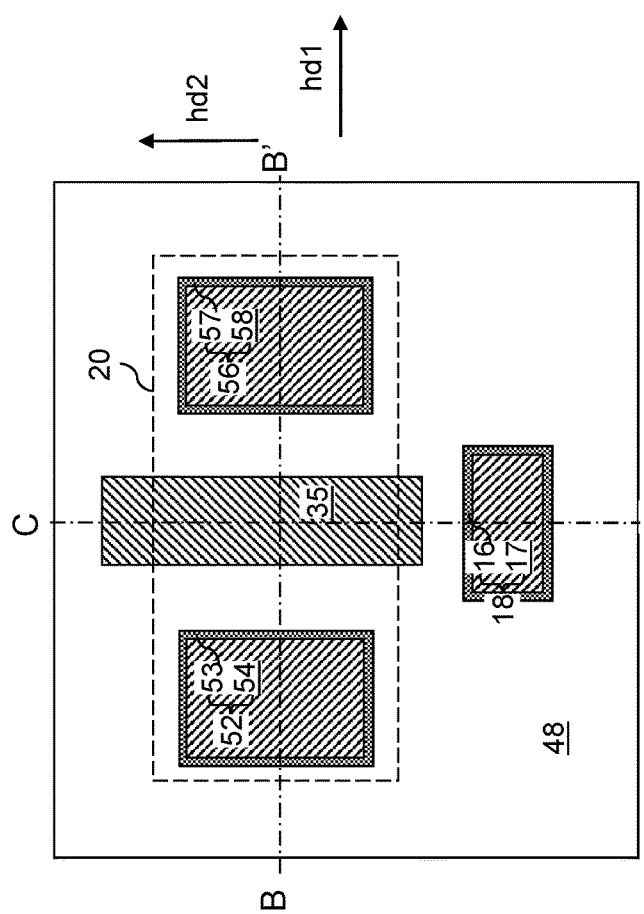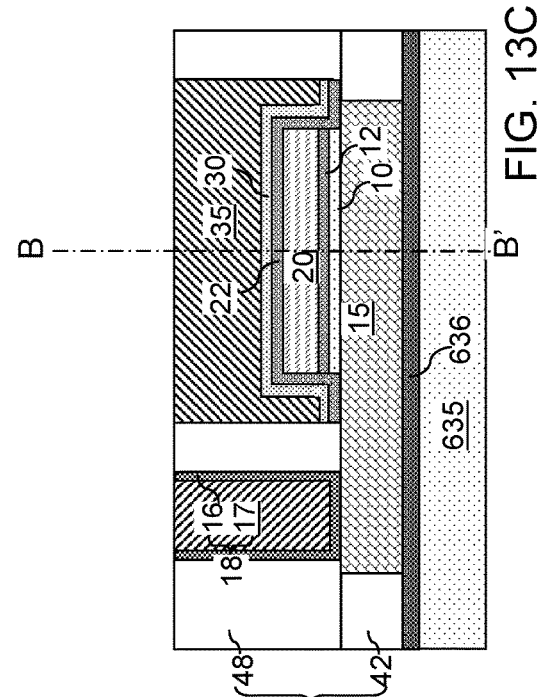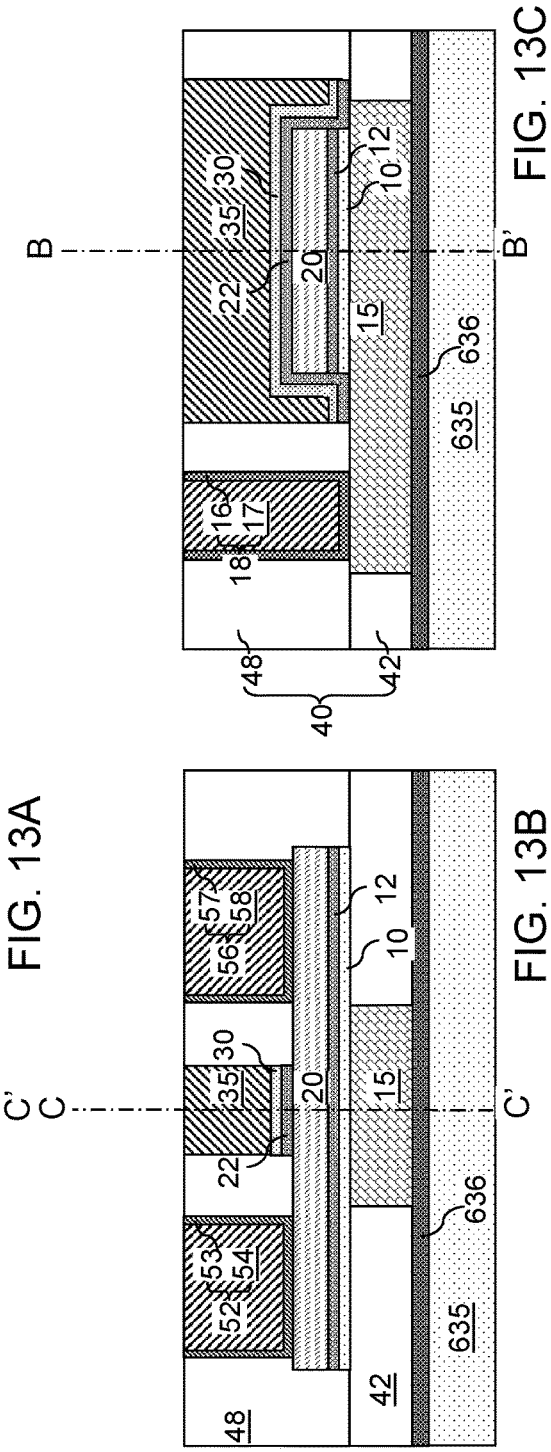

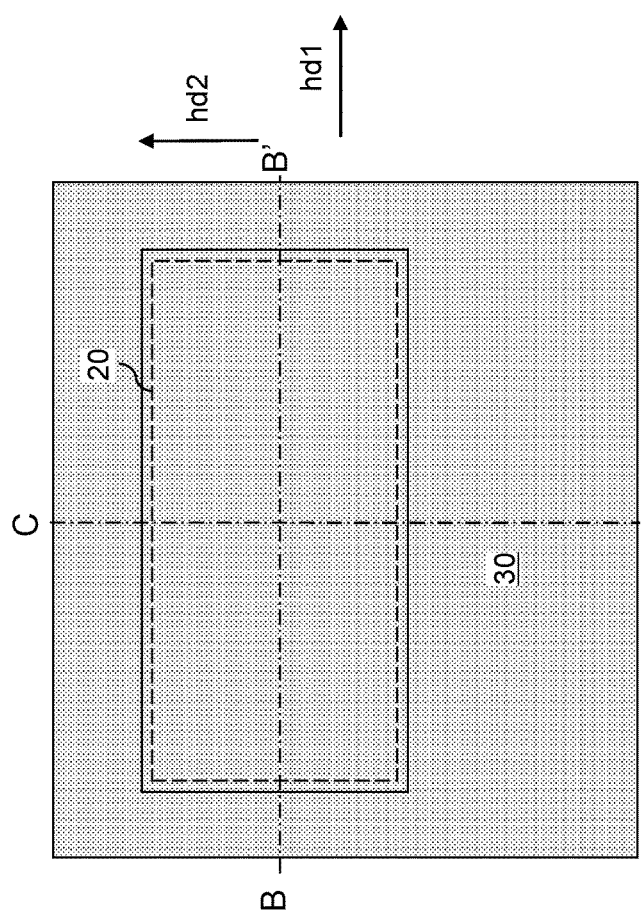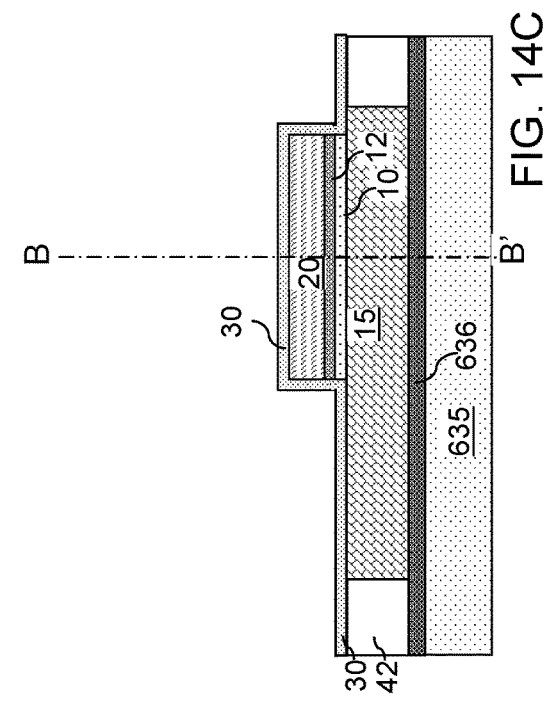

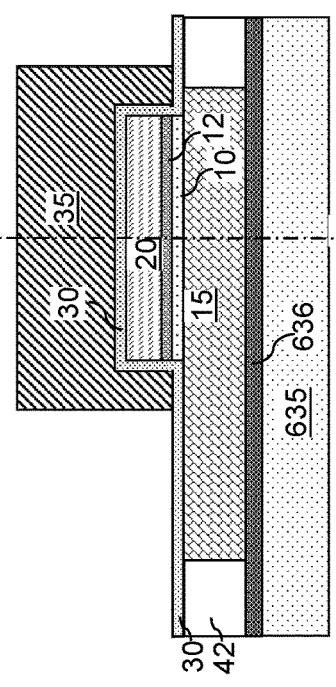
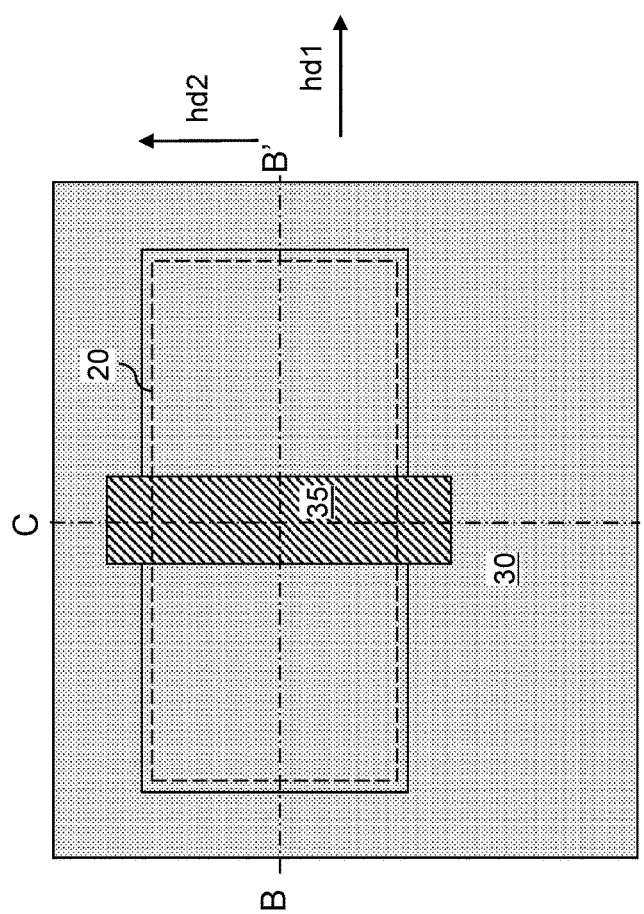
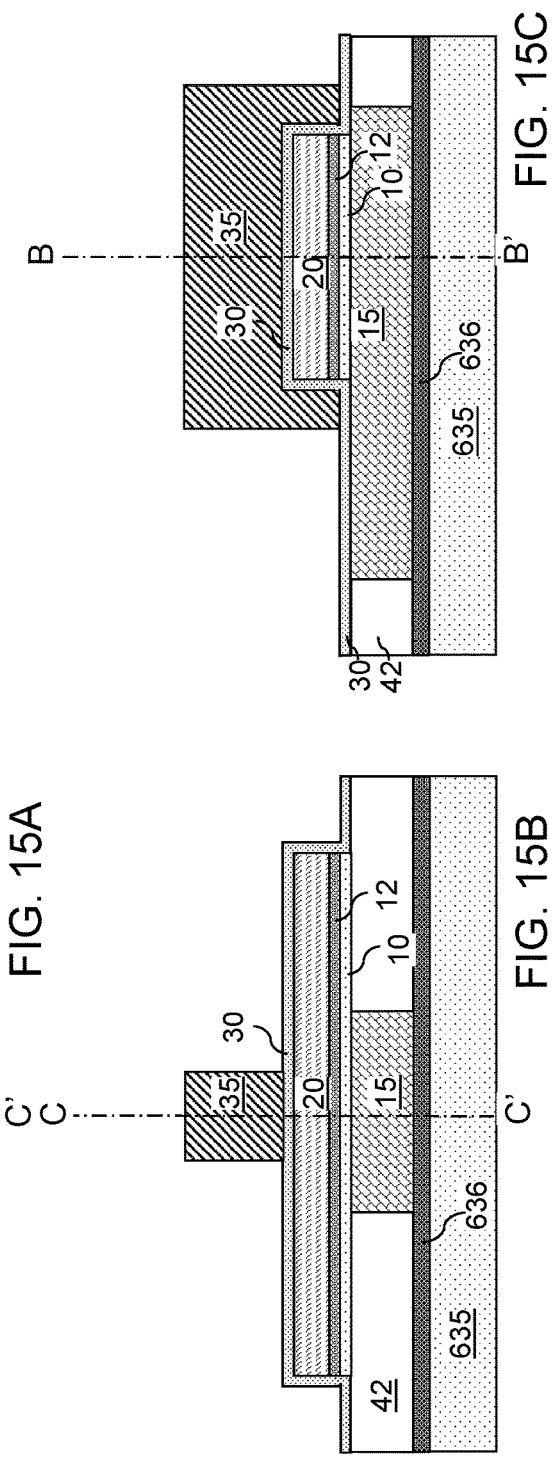

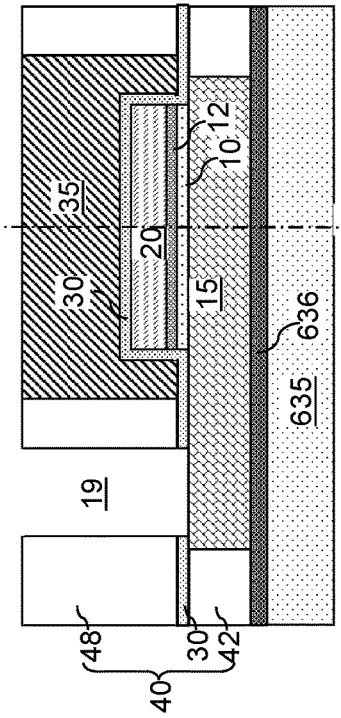
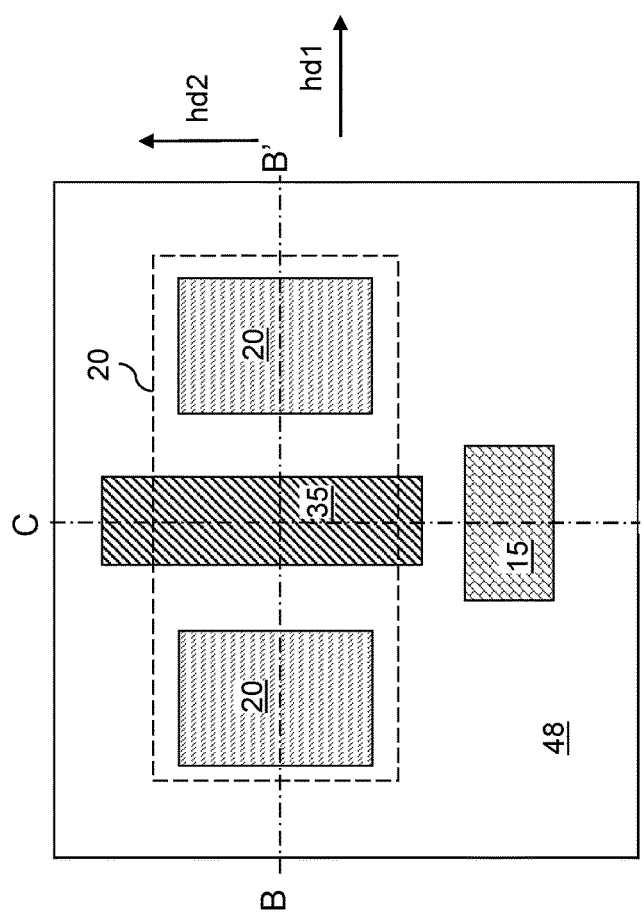
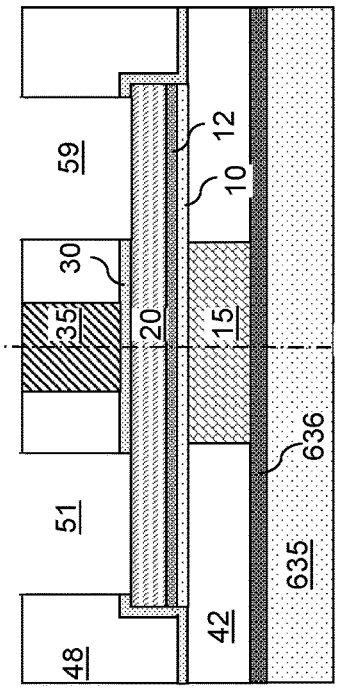

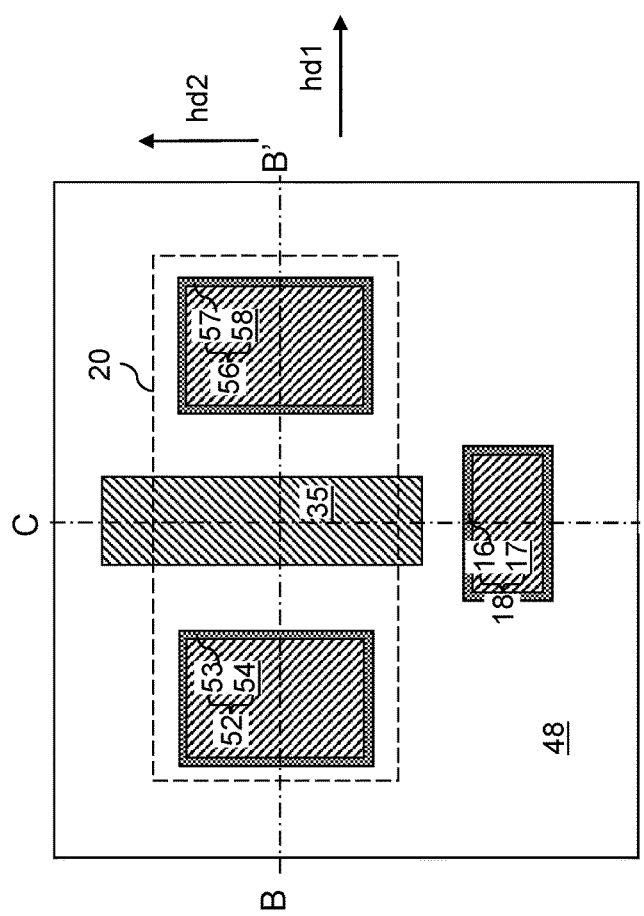
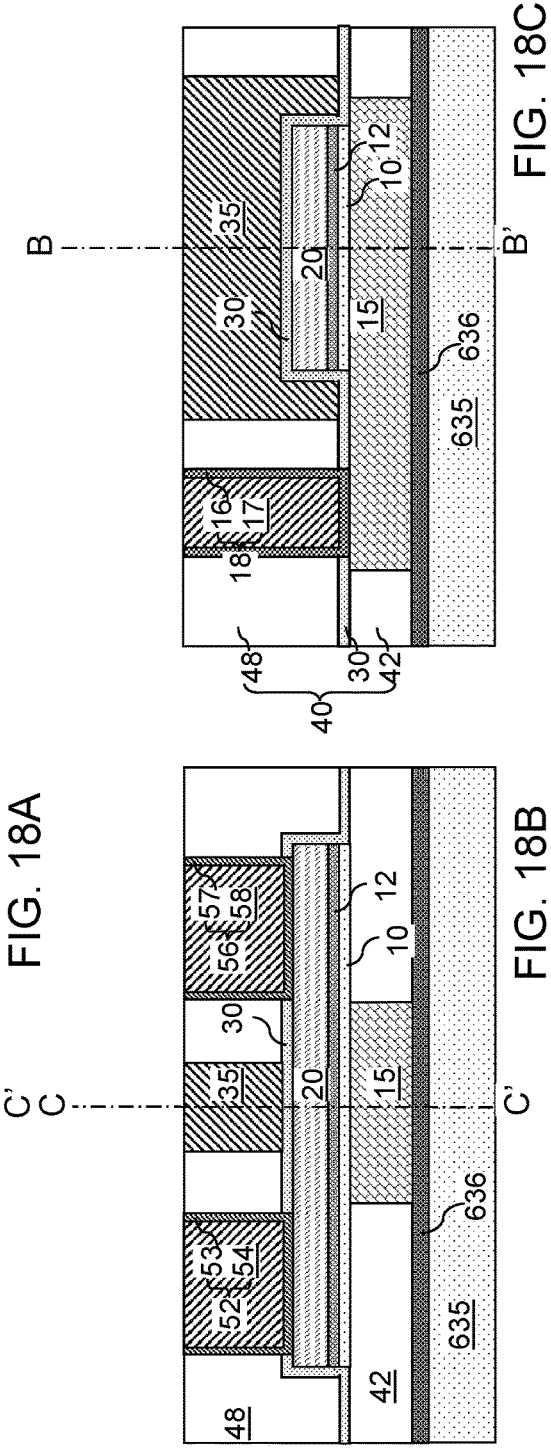
FIG. 18A
FIG. 18B
FIG. 18C

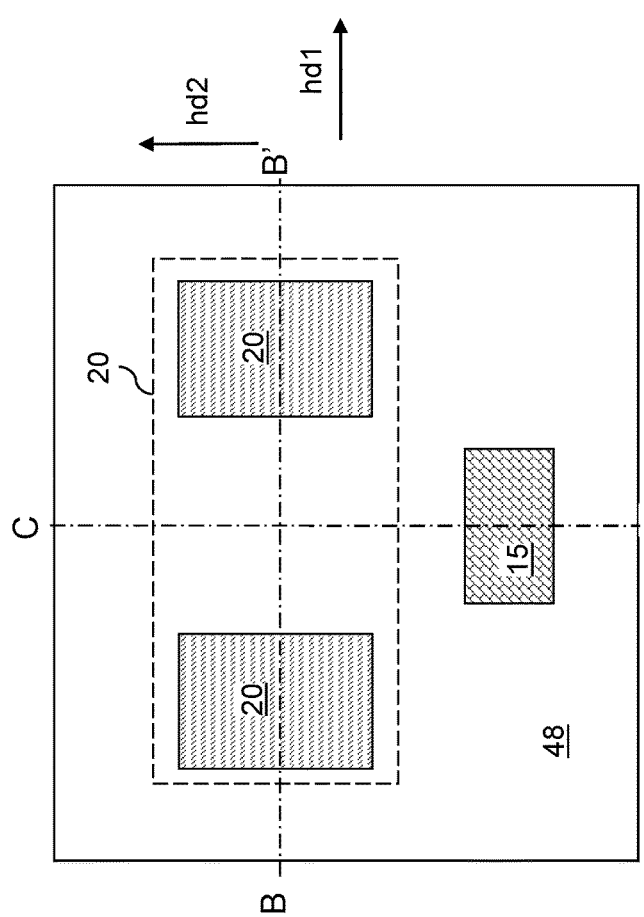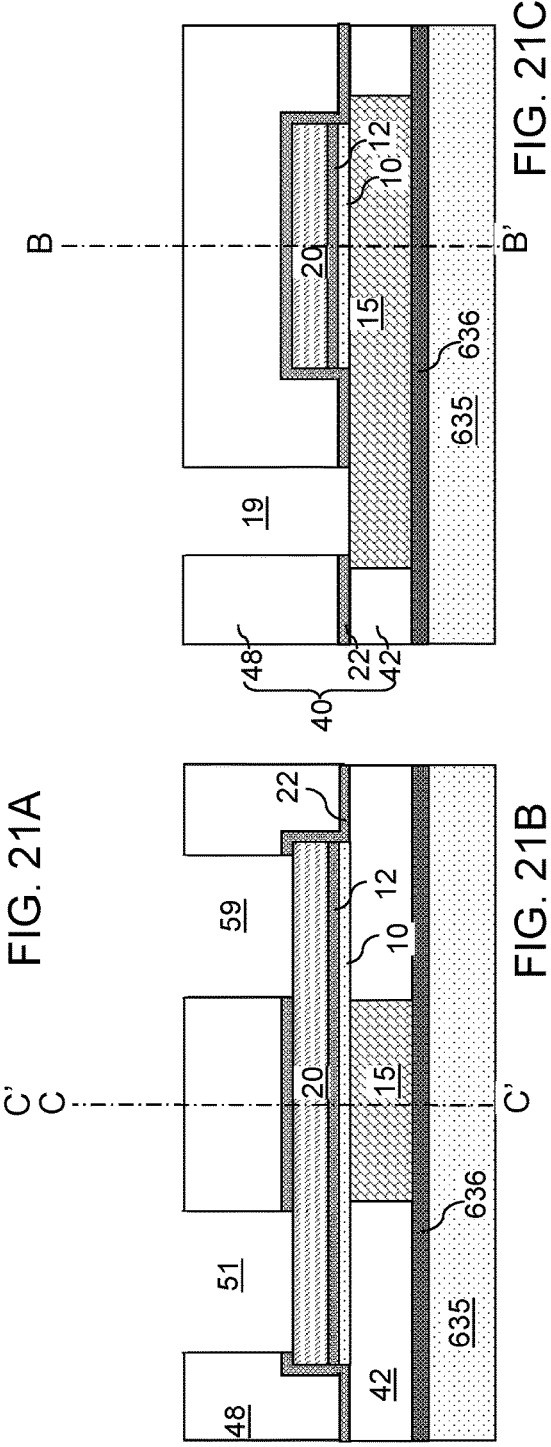

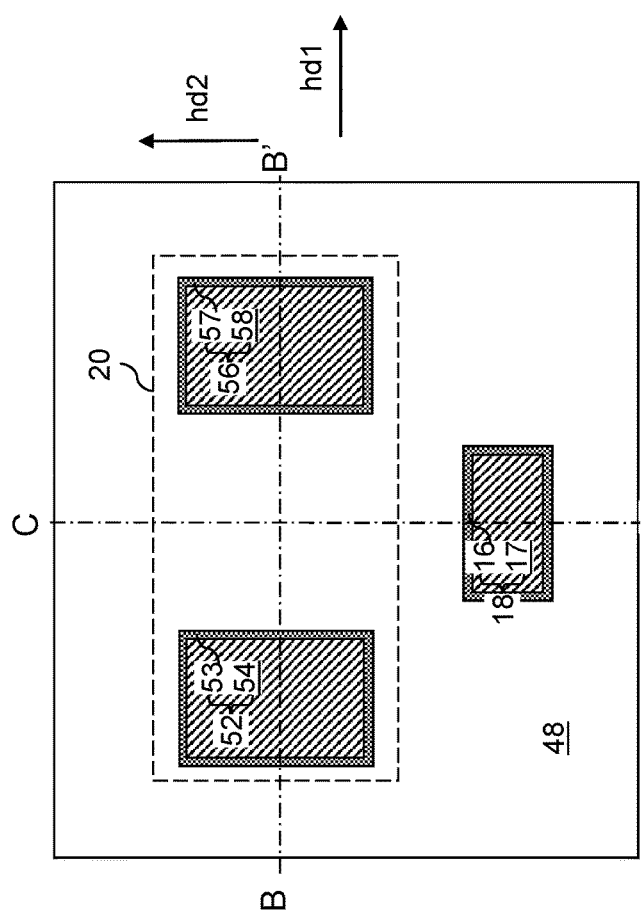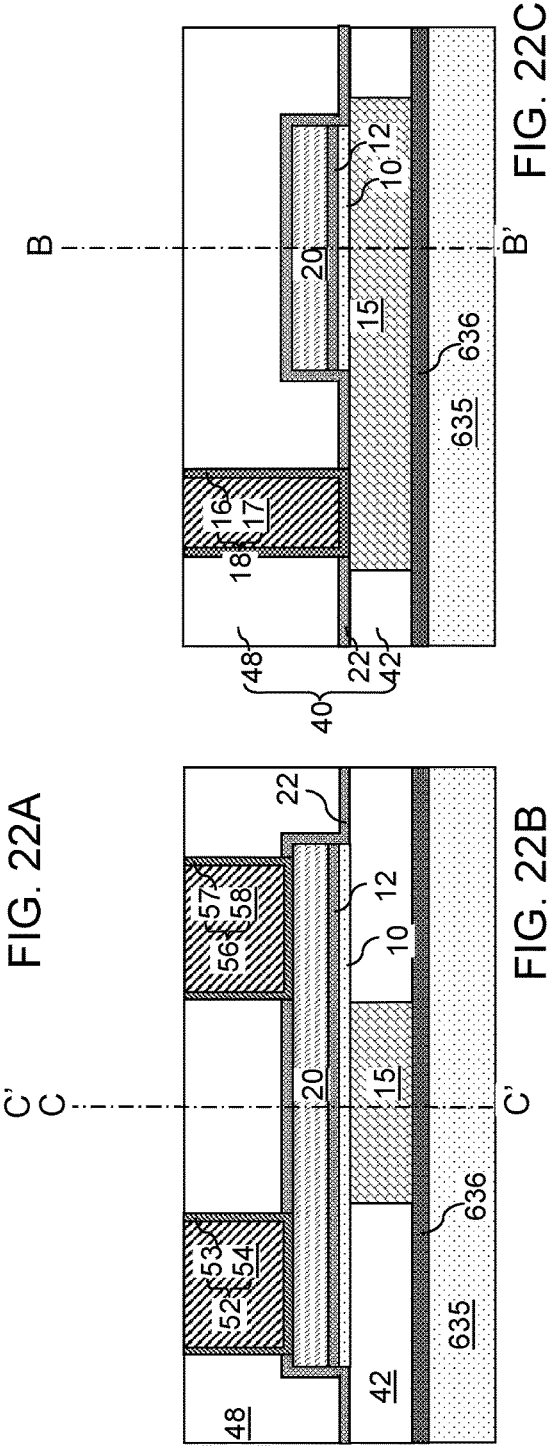

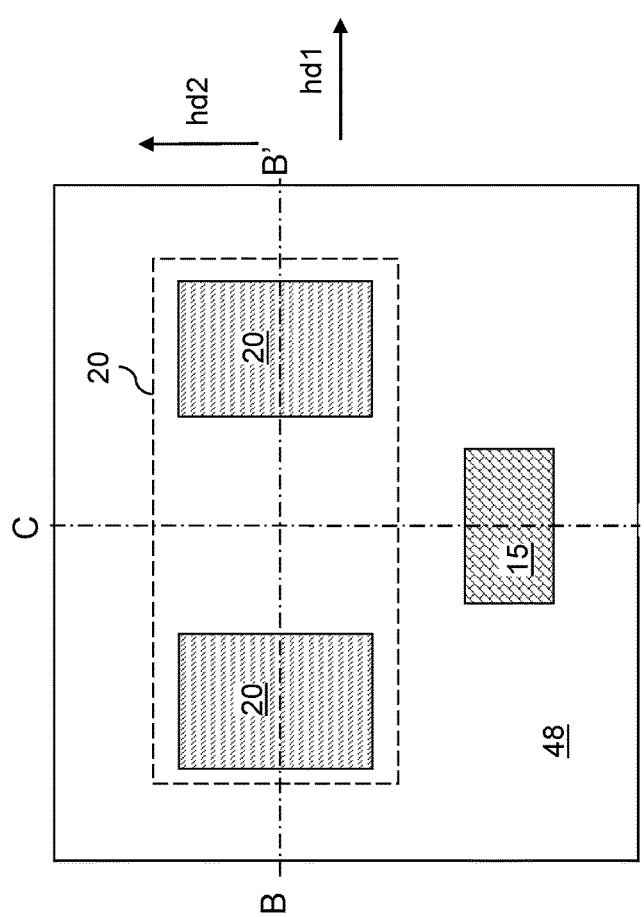
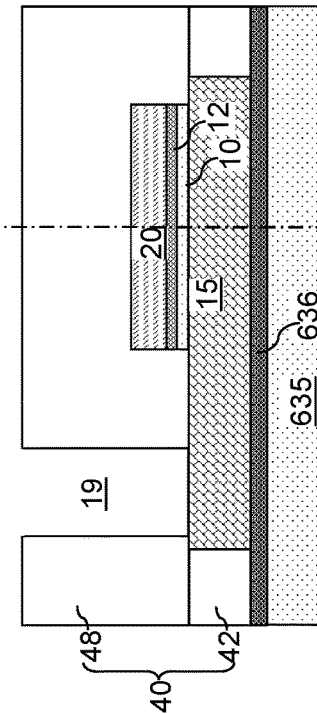
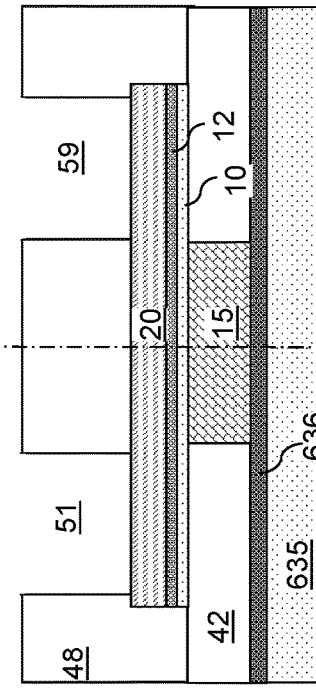

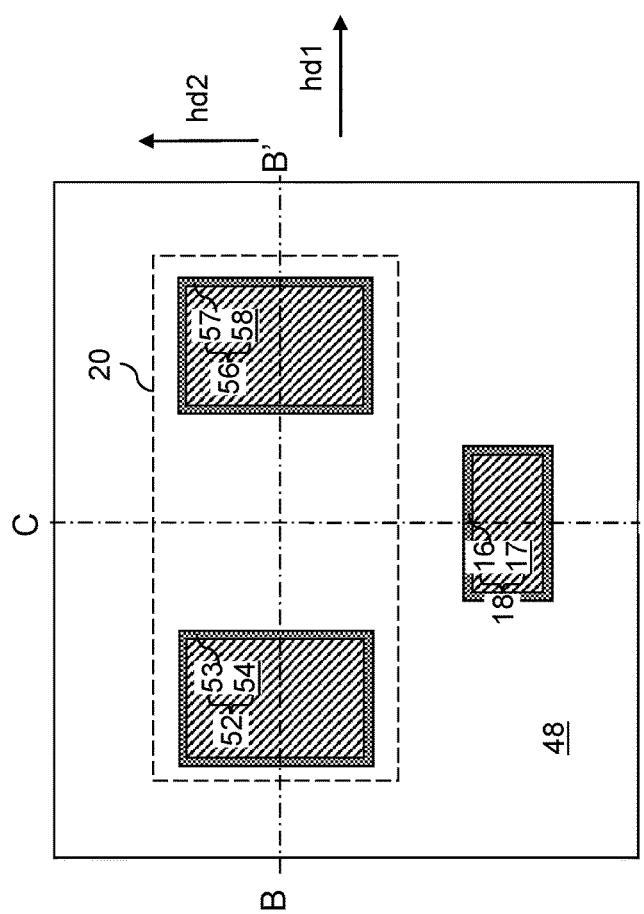
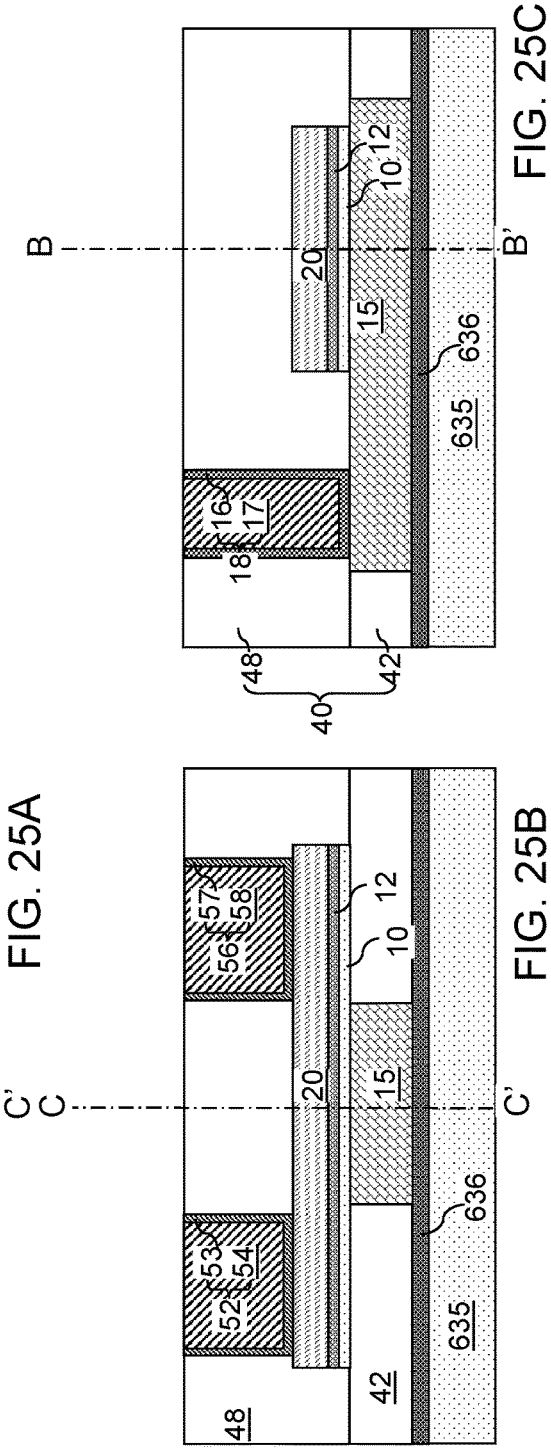

THIN FILM TRANSISTOR INCLUDING A DIELECTRIC DIFFUSION BARRIER AND METHODS FOR FORMING THE SAME

RELATED APPLICATIONS

This application claims the benefit of priority from a U.S. provisional application Ser. No. 63/147,252, entitled "A Structure of TFT", filed on Feb. 9, 2021, the entire contents of which are incorporated herein by reference.

BACKGROUND

Thin film transistors (TFT) made of oxide semiconductors are an attractive option for back-end-of-line (BEOL) integration since TFTs may be processed at low temperatures and thus, will not damage previously fabricated devices. For example, the fabrication conditions and techniques may not damage previously fabricated front-end-of-line (FEOL) and middle end-of-line (MEOL) devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3A is a top-down view of a region of the first exemplary structure after formation of a recess region in the insulating layer according to the first embodiment of the present disclosure.

FIG. 3B is a vertical cross-sectional view of the first exemplary structure along the vertical plane B-B' of FIG. 3A.

FIG. 3C is a vertical cross-sectional view of the first exemplary structure along the vertical plane C-C' of FIG. 3A.

FIG. 4A is a top-down view of a region of the first exemplary structure after formation of a bottom gate electrode according to the first embodiment of the present disclosure.

FIG. 4B is a vertical cross-sectional view of the first exemplary structure along the vertical plane B-B' of FIG. 4A.

FIG. 4C is a vertical cross-sectional view of the first exemplary structure along the vertical plane C-C' of FIG. 4A.

FIG. 5A is a top-down view of a region of the first exemplary structure after formation of a continuous bottom gate dielectric layer, a continuous dielectric diffusion barrier liner, and a continuous active layer according to the first embodiment of the present disclosure.

FIG. 5B is a vertical cross-sectional view of the first exemplary structure along the vertical plane B-B' of FIG. 5A.

FIG. 5C is a vertical cross-sectional view of the first exemplary structure along the vertical plane C-C' of FIG. 5A.

FIG. 6A is a top-down view of a region of the first exemplary structure after formation of a bottom gate dielectric, a dielectric diffusion barrier liner, and an active layer according to the first embodiment of the present disclosure.

FIG. 6B is a vertical cross-sectional view of the first exemplary structure along the vertical plane B-B' of FIG. 6A.

FIG. 6C is a vertical cross-sectional view of the first exemplary structure along the vertical plane C-C' of FIG. 6A.

FIG. 8A is a top-down view of a region of the first exemplary structure after formation of a top gate electrode according to the first embodiment of the present disclosure.

FIG. 8B is a vertical cross-sectional view of the first exemplary structure along the vertical plane B-B' of FIG. 8A.

FIG. 8C is a vertical cross-sectional view of the first exemplary structure along the vertical plane C-C' of FIG. 8A.

FIG. 9A is a top-down view of a region of the first exemplary structure after formation of a dielectric layer according to the first embodiment of the present disclosure.

FIG. 9B is a vertical cross-sectional view of the first exemplary structure along the vertical plane B-B' of FIG. 9A.

FIG. 9C is a vertical cross-sectional view of the first exemplary structure along the vertical plane C-C' of FIG. 9A.

FIG. 10A is a top-down view of a region of the first exemplary structure after formation of a source cavity, a drain cavity, and a bottom gate contact via cavity according to the first embodiment of the present disclosure.

FIG. 10B is a vertical cross-sectional view of the first exemplary structure along the vertical plane B-B' of FIG. 10A.

FIG. 10C is a vertical cross-sectional view of the first exemplary structure along the vertical plane C-C' of FIG. 10A.

FIG. 11A is a top-down view of a region of the first exemplary structure after formation of a source electrode, a drain electrode, and a backside electrode contact via structure according to the first embodiment of the present disclosure.

FIG. 11B is a vertical cross-sectional view of the first exemplary structure along the vertical plane B-B' of FIG. 11A.

FIG. 11C is a vertical cross-sectional view of the first exemplary structure along the vertical plane C-C' of FIG. 11A.

FIG. 12A is a top-down view of a region of a first alternative configuration of the first exemplary structure after formation of a source electrode, a drain electrode, and a backside electrode contact via structure according to the first embodiment of the present disclosure.

FIG. 12B is a vertical cross-sectional view of the first exemplary structure along the vertical plane B-B' of FIG. 12A.

FIG. 12C is a vertical cross-sectional view of the first exemplary structure along the vertical plane C-C' of FIG. 12A.

FIG. 13A is a top-down view of a region of a second alternative configuration of the first exemplary structure after formation of a source electrode, a drain electrode, and a backside electrode contact via structure according to the first embodiment of the present disclosure.

FIG. 13B is a vertical cross-sectional view of the first exemplary structure along the vertical plane B-B' of FIG. 13A.

FIG. 13C is a vertical cross-sectional view of the first exemplary structure along the vertical plane C-C' of FIG. 13A.

FIG. 14A is a top-down view of a region of a second exemplary structure after formation of a top gate dielectric according to a second embodiment of the present disclosure.

FIG. 14B is a vertical cross-sectional view of the second exemplary structure along the vertical plane B-B' of FIG. 14A.

FIG. 14C is a vertical cross-sectional view of the second exemplary structure along the vertical plane C-C' of FIG. 14A.

FIG. 15A is a top-down view of a region of the second exemplary structure after formation of a top gate electrode according to the second embodiment of the present disclosure.

FIG. 15B is a vertical cross-sectional view of the second exemplary structure along the vertical plane B-B' of FIG. 15A.

FIG. 15C is a vertical cross-sectional view of the second exemplary structure along the vertical plane C-C' of FIG. 15A.

FIG. 17A is a top-down view of a region of the second exemplary structure after formation of a source cavity, a drain cavity, a gate cavity, and a bottom gate contact via cavity according to the second embodiment of the present disclosure.

FIG. 17B is a vertical cross-sectional view of the second exemplary structure along the vertical plane B-B' of FIG. 17A.

FIG. 17C is a vertical cross-sectional view of the second exemplary structure along the vertical plane C-C' of FIG. 17A.

FIG. 18A is a top-down view of a region of the second exemplary structure after formation of a source electrode, a drain electrode, and a backside electrode contact via structure according to the second embodiment of the present disclosure.

FIG. 18B is a vertical cross-sectional view of the second exemplary structure along the vertical plane B-B' of FIG. 18A.

FIG. 18C is a vertical cross-sectional view of the second exemplary structure along the vertical plane C-C' of FIG. 18A.

FIG. 21A is a top-down view of a region of the third exemplary structure after formation of a dielectric layer and a source cavity, a drain cavity, a gate cavity, and a bottom gate contact via cavity according to the third embodiment of the present disclosure.

FIG. 21B is a vertical cross-sectional view of the third exemplary structure along the vertical plane B-B' of FIG. 21A.

FIG. 21C is a vertical cross-sectional view of the third exemplary structure along the vertical plane C-C' of FIG. 21A.

FIG. 22A is a top-down view of a region of the third exemplary structure after formation of a source electrode, a drain electrode, and a backside electrode contact via structure according to the third embodiment of the present disclosure.

FIG. 22B is a vertical cross-sectional view of the third exemplary structure along the vertical plane B-B' of FIG. 22A.

FIG. 22C is a vertical cross-sectional view of the third exemplary structure along the vertical plane C-C' of FIG. 22A.

FIG. 24A is a top-down view of a region of the fourth exemplary structure after formation of a source cavity, a drain cavity, a gate cavity, and a bottom gate contact via cavity according to the fourth embodiment of the present disclosure.

FIG. 24B is a vertical cross-sectional view of the fourth exemplary structure along the vertical plane B-B' of FIG. 24A.

FIG. 24C is a vertical cross-sectional view of the fourth exemplary structure along the vertical plane C-C' of FIG. 24A.

FIG. 25A is a top-down view of a region of the fourth exemplary structure after formation of a source electrode, a drain electrode, and a backside electrode contact via structure according to the fourth embodiment of the present disclosure.

FIG. 25B is a vertical cross-sectional view of the fourth exemplary structure along the vertical plane B-B' of FIG. 25A.

FIG. 25C is a vertical cross-sectional view of the fourth exemplary structure along the vertical plane C-C' of FIG. 25A.

DETAILED DESCRIPTION

Figure 1:
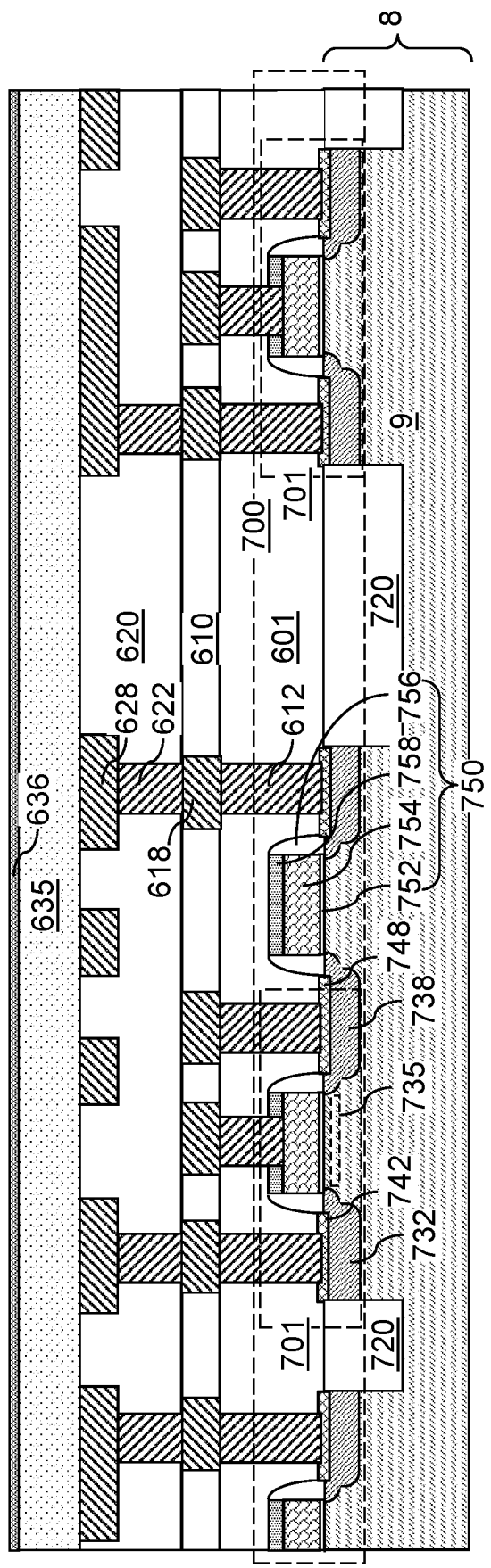
FIG. 1 is a vertical cross-sectional view of a first exemplary structure after formation of complementary metal-oxide-semiconductor (CMOS) transistors, first metal interconnect structures formed in lower-level dielectric layers, an insulating spacer layer, and an optional etch stop dielectric layer according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Elements with the same reference numerals refer to the same element, and are presumed to have the same material composition and the same thickness range unless expressly indicated otherwise.

Generally, the structures and methods of the present disclosure may be used to form a semiconductor structure including at least one thin film transistor such as a plurality of thin film transistors. The thin film transistors may be formed over any substrate, which may be an insulating substrate, a conductive substrate, or a semiconducting substrate. In embodiments that utilize a conductive substrate or a semiconductor substrate, at least one insulating layer may be used to provide electrical isolation between the thin film transistors and the underlying substrate. In embodiments in which a semiconductor substrate such as a single crystalline silicon substrate is used, field effect transistors using portions of the semiconductor substrate as semiconductor channels may be formed on the semiconductor substrate, and metal interconnect structures embedded in interconnect-level dielectric layers may be formed over the field effect transistors. The thin film transistors may be formed over the field effect transistors including single crystalline semiconductor channels and over the metal interconnect structures, which are herein referred to as lower-level metal interconnect structures.

According to an aspect of the present disclosure, a dielectric diffusion barrier liner may be formed on the bottom side of each active layer, which includes a polycrystalline semiconductor channel of a respective thin film transistor. Specifically, a dielectric diffusion barrier liner may be formed between a bottom gate dielectric and an active layer of each thin film transistor. Optionally, a capping dielectric diffusion barrier liner may be formed over the active layers. The dielectric diffusion barrier liner and the optional capping dielectric diffusion barrier liner prevents diffusion of metallic elements out of the active layers during a subsequent anneal process, and thus, prevents changes in the material composition within the active layers and deleterious properties in the transistor characteristics of the thin film transistors. The various aspects of embodiments of the present disclosure are described now in detail.

Referring to FIG. 1, a first exemplary structure according to a first embodiment of the present disclosure is illustrated. The first exemplary structure includes a substrate 8, which may be a semiconductor substrate such as a commercially available silicon substrate. The substrate 8 may include a semiconductor material layer 9 at least at an upper portion thereof. The semiconductor material layer 9 may be a surface portion of a bulk semiconductor substrate, or may be a top semiconductor layer of a semiconductor-on-insulator (SOI) substrate. In one embodiment, the semiconductor material layer 9 includes a single crystalline semiconductor material such as single crystalline silicon. In one embodiment, the substrate 8 may include a single crystalline silicon substrate including a single crystalline silicon material.

Shallow trench isolation structures 720 including a dielectric material such as silicon oxide may be formed in an upper portion of the semiconductor material layer 9. Suitable doped semiconductor wells, such as p-type wells and n-type wells, may be formed within each area that is laterally enclosed by a portion of the shallow trench isolation structures 720. Field effect transistors 701 may be formed over the top surface of the semiconductor material layer 9. For example, each field effect transistor 701 may include a source electrode 732, a drain electrode 738, a semiconductor channel 735 that includes a surface portion of the substrate 8 extending between the source electrode 732 and the drain electrode 738, and a gate structure 750. The semiconductor channel 735 may include a single crystalline semiconductor material. Each gate structure 750 may include a gate dielectric layer 752, a gate electrode 754, a gate cap dielectric 758, and a dielectric gate spacer 756. A source-side metal-semiconductor alloy region 742 may be formed on each source electrode 732, and a drain-side metal-semiconductor alloy region 748 may be formed on each drain electrode 738.

In embodiments in which an array of memory cells may be subsequently formed at a level of a dielectric layer, the field effect transistors 701 may include a circuit that provides functions that operate the array of memory cells. Specifically, devices in the peripheral region may be configured to control the programming operation, the erase operation, and the sensing (read) operation of the array of memory cells. For example, the devices in the peripheral region may include a sensing circuitry and/or a programming circuitry. The devices formed on the top surface of the semiconductor material layer 9 may include complementary metal-oxide-semiconductor (CMOS) transistors and optionally additional semiconductor devices (such as resistors, diodes, capacitors, etc.), and are collectively referred to as CMOS circuitry 700.

One or more of the field effect transistors 701 in the CMOS circuitry 700 may include a semiconductor channel 735 that contains a portion of the semiconductor material layer 9 in the substrate 8. If the semiconductor material layer 9 includes a single crystalline semiconductor material such as single crystalline silicon, the semiconductor channel 735 of each field effect transistor 701 in the CMOS circuitry 700 may include a single crystalline semiconductor channel such as a single crystalline silicon channel. In one embodiment, a plurality of field effect transistors 701 in the CMOS circuitry 700 may include a respective node that is subsequently electrically connected to a node of a respective ferroelectric memory cell to be subsequently formed. For example, a plurality of field effect transistors 701 in the CMOS circuitry 700 may include a respective source electrode 732 or a respective drain electrode 738 that is subsequently electrically connected to a node of a respective ferroelectric memory cell to be subsequently formed.

In one embodiment, the CMOS circuitry 700 may include a programming control circuit configured to control gate voltages of a set of field effect transistors 701 that are used for programming a respective ferroelectric memory cell and to control gate voltages of thin film transistors to be subsequently formed. In this embodiment, the programming control circuit may be configured to provide a first programming pulse that programs a respective ferroelectric dielectric layer in a selected ferroelectric memory cell into a first polarization state in which electrical polarization in the ferroelectric dielectric layer points toward a first electrode of the selected ferroelectric memory cell, and to provide a second programming pulse that programs the ferroelectric dielectric layer in the selected ferroelectric memory cell into a second polarization state in which the electrical polarization in the ferroelectric dielectric layer points toward a second electrode of the selected ferroelectric memory cell.

In one embodiment, the substrate 8 may include a single crystalline silicon substrate, and the field effect transistors 701 may include a respective portion of the single crystalline silicon substrate as a semiconducting channel. As used herein, a "semiconducting" element refers to an element having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant.

According to an aspect of the present disclosure, the field effect transistors 701 may be subsequently electrically connected to drain electrodes and gate electrodes of access transistors including active layers to be formed above the field effect transistors 701. In one embodiment, a subset of the field effect transistors 701 may be subsequently electrically connected to at least one of the drain electrodes and the gate electrodes. For example, the field effect transistors 701 may comprise first word line drivers configured to apply a first gate voltage to first word lines through a first subset of lower-level metal interconnect structures to be subsequently formed, and second word line drivers configured to apply a second gate voltage to second word lines through a second subset of the lower-level metal interconnect structures. Further, the field effect transistors 701 may comprise bit line drivers configured to apply a bit line bias voltage to bit lines to be subsequently formed, and sense amplifiers configured to detect electrical current that flows through the bit lines during a read operation.

Various metal interconnect structures formed within dielectric layers may be subsequently formed over the substrate 8 and the semiconductor devices thereupon (such as field effect transistors 701). In an illustrative example, the dielectric layers may include, for example, a first dielectric layer 601 that may be a layer that surrounds the contact structure connected to the source and drains (sometimes referred to as a contact-level dielectric layer 601), a first interconnect-level dielectric layer 610, and a second interconnect-level dielectric layer 620. The metal interconnect structures may include device contact via structures 612 formed in the first dielectric layer 601 and contact a respective component of the CMOS circuitry 700, first metal line structures 618 formed in the first interconnect-level dielectric layer 610, first metal via structures 622 formed in a lower portion of the second interconnect-level dielectric layer 620, and second metal line structures 628 formed in an upper portion of the second interconnect-level dielectric layer 620.

Each of the dielectric layers (601, 610, 620) may include a dielectric material such as undoped silicate glass, a doped silicate glass, organosilicate glass, amorphous fluorinated carbon, porous variants thereof, or combinations thereof. Each of the metal interconnect structures (612, 618, 622, 628) may include at least one conductive material, which may be a combination of a metallic liner (such as a metallic nitride or a metallic carbide) and a metallic fill material. Each metallic liner may include TiN, TaN, WN, TiC, TaC, and WC, and each metallic fill material portion may include W, Cu, Al, Co, Ru, Mo, Ta, Ti, alloys thereof, and/or combinations thereof. Other suitable metallic liner and metallic fill materials within the contemplated scope of disclosure may also be used. In one embodiment, the first metal via structures 622 and the second metal line structures 628 may be formed as integrated line and via structures by a dual damascene process. The dielectric layers (601, 610, 620) are herein referred to as lower-level dielectric layers. The metal interconnect structures (612, 618, 622, 628) formed within in the lower-level dielectric layers are herein referred to as lower-level metal interconnect structures.

While the present disclosure is described using an embodiment wherein thin film transistors may be formed over the second interconnect-level dielectric layer 620, other embodiments are expressly contemplated herein in which the array of memory cells may be formed at a different metal interconnect level. Further, while the present disclosure is described using an embodiment in which a semiconductor substrate is used as the substrate 8, embodiments are expressly contemplated herein in which an insulating substrate or a conductive substrate is used as the substrate 8.

The set of all dielectric layer that are formed prior to formation of an array of thin film transistors or an array of ferroelectric memory cells is collectively referred to as lower-level dielectric layers (601, 610, 620). The set of all metal interconnect structures that is formed within the lower-level dielectric layers (601, 610, 620) is herein referred to as first metal interconnect structures (612, 618, 622, 628). Generally, first metal interconnect structures (612, 618, 622, 628) formed within at least one lower-level dielectric layer (601, 610, 620) may be formed over the semiconductor material layer 9 that is located in the substrate 8.

According to an aspect of the present disclosure, thin film transistors (TFTs) may be subsequently formed in a metal interconnect level that overlies the metal interconnect levels that contain the lower-level dielectric layers (601, 610, 620) and the first metal interconnect structures (612, 618, 622, 628). In one embodiment, a planar dielectric layer having a uniform thickness may be formed over the lower-level dielectric layers (601, 610, 620). The planar dielectric layer is herein referred to as an insulating spacer layer 635. The insulating spacer layer 635 includes a dielectric material such as undoped silicate glass, a doped silicate glass, organosilicate glass, or a porous dielectric material, and may be deposited by chemical vapor deposition. The thickness of the insulating spacer layer 635 may be in a range from 20 nm to 300 nm, although lesser and greater thicknesses may also be used.

Generally, interconnect-level dielectric layers (such as the lower-level dielectric layer (601, 610, 620)) containing therein the metal interconnect structures (such as the first metal interconnect structures (612, 618, 622, 628)) may be formed over semiconductor devices. The insulating spacer layer 635 may be formed over the interconnect-level dielectric layers.

In one embodiment, the substrate 8 may comprise a single crystalline silicon substrate, and lower-level dielectric layers (601, 610, 620) embedding lower-level metal interconnect structures (612, 618, 622, 628) may be located above the single crystalline silicon substrate. Field effect transistors 701 including a respective portion of the single crystalline silicon substrate as a channel may be embedded within the lower-level dielectric layers (601, 610, 620). The field effect transistors may be subsequently electrically connected to at least one of a gate electrode, a source electrode, and a drain electrode of one or more, or each, of thin film transistors to be subsequently formed.

An etch stop dielectric layer 636 may be optionally formed over the insulating spacer layer 635. The etch stop dielectric layer 636 includes an etch stop dielectric material providing higher etch resistance to an etch chemistry during a subsequently anisotropic etch process that etches a dielectric material to be subsequently deposited over the etch stop dielectric layer 636. For example, the etch stop dielectric layer 636 may include silicon carbide nitride, silicon nitride, silicon oxynitride, or a dielectric metal oxide such as aluminum oxide. The thickness of the etch stop dielectric layer 636 may be in a range from 2 nm to 40 nm, such as from 4 nm to 20 nm, although lesser and greater thicknesses may also be used.

Figure 2A:
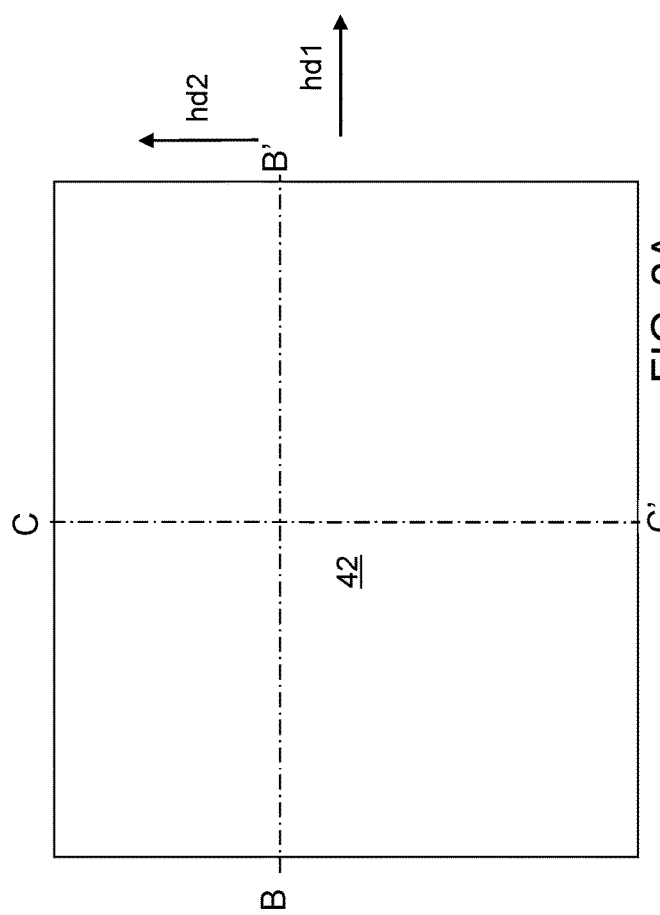
FIG. 2A is a top-down view of a portion of the first exemplary structure after formation of an insulating layer according to a first embodiment of the present disclosure.
Figure 2C:
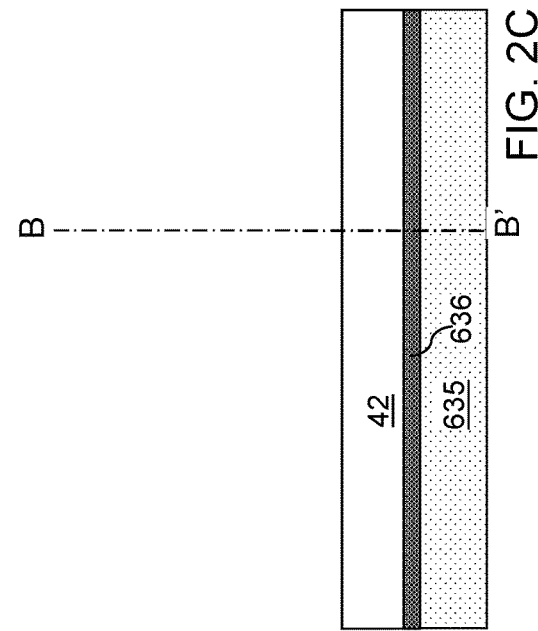
FIG. 2C is a vertical cross-sectional view of the first exemplary structure along the vertical plane C-C' of FIG. 2A.
Figure 2B:
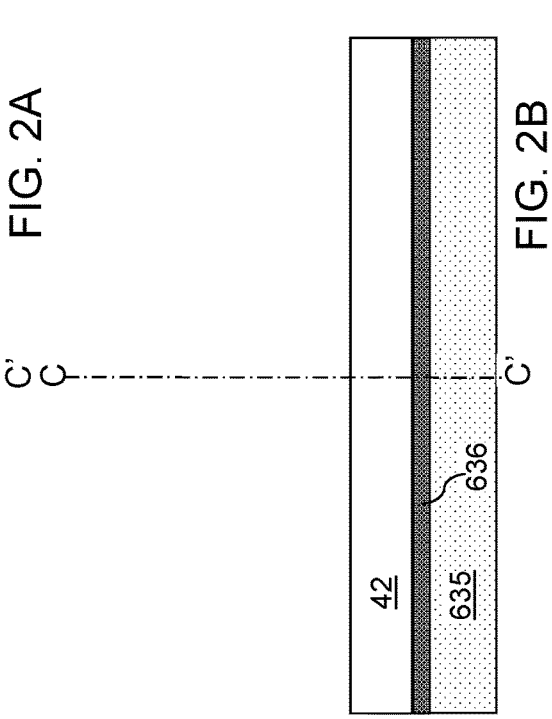
FIG. 2B is a vertical cross-sectional view of the first exemplary structure along the vertical plane B-B' of FIG. 2A.

Referring to FIGS. 2A-2C, a region of the first exemplary structure is illustrated, which corresponds to an area in which a thin film transistor is to be subsequently formed. While the present disclosure is described using a single instance of a thin film transistor, it is understood that multiple instances of the thin film transistor may be simultaneously formed in any of the exemplary structures of the present disclosure.

An insulating layer 42 may be formed over the insulating spacer layer 635 and the optional etch stop dielectric layer 636. The insulating layer 42 includes a dielectric material such as undoped silicate glass, a doped silicate glass, organosilicate glass, or a porous dielectric material, and may be deposited by chemical vapor deposition. The thickness of the insulating layer 42 may be in a range from 20 nm to 300 nm, although lesser and greater thicknesses may also be used. Multiple thin film transistors may be subsequently formed over the insulating layer 42. In one embodiment, the multiple thin film transistors may be arranged along a first horizontal direction hd1 and a second horizontal direction hd2, which may be perpendicular to the first horizontal direction hd1.

Referring to FIGS. 3A-3C, a photoresist layer (not shown) may be applied over a top surface of the insulating layer 42, and may be lithographically patterned to form an opening within the illustrated area. In one embodiment, the opening may be a rectangular opening having a pair of widthwise sidewalls along the first horizontal direction hd1 and having a pair of lengthwise sidewalls along the second horizontal direction hd2. An anisotropic etch process may be performed to transfer the pattern of the openings in the photoresist layer into an upper portion of the insulating layer 42. A recess region 11 may be formed in an upper portion of the insulating layer 42. The recess region 11 is also referred to as a bottom gate trench.

In one embodiment, the width of the recess region 11 along the first horizontal direction hd1 may be in a range from 20 nm to 300 nm, although lesser and greater widths may also be used. In one embodiment, the length of the recess region 11 along the second horizontal direction hd2 may be in a range from 30 nm to 3,000 nm, although lesser and greater lengths may also be used. The depth of the recess region 11 may be the same as the thickness of the insulating layer 42. Thus, a top surface of the optional etch stop dielectric layer 636 or a top surface of the insulating spacer layer 635 (in embodiments in which the etch stop dielectric layer 636 is not used) is exposed. The photoresist layer may be subsequently removed, for example, by ashing.

Referring to FIGS. 4A-4C, at least one conductive material may be deposited in the recess region 11. The at least one conductive material may include, for example, a metallic barrier liner material (such as TiN, TaN, and/or WN) and a metallic fill material (such as Cu, W, Mo, Co, Ru, etc.). Other suitable metallic liner and metallic fill materials within the contemplated scope of disclosure may also be used. Excess portions of the at least one conductive material may be removed from above the horizontal plane including the top surface of the insulating layer 42 by a planarization process, which may include a chemical mechanical polishing (CMP) process and/or a recess etch process. The planarization process may use a chemical mechanical polishing process or a recess etch process. A bottom gate electrode 15 may be formed in the recess region 11. The bottom gate electrode 15 may be the only electrode of a thin film transistor to be subsequently formed, or may be one of two gate electrodes of a thin film transistor in embodiments in which a top gate electrode is subsequently formed. The top surface of the bottom gate electrode 15 may be located within a same horizontal plane as the top surface of the insulating layer 42.

Referring to FIGS. 5A-5C, a continuous bottom gate dielectric layer 10C, a continuous dielectric diffusion barrier liner 12C, and a continuous active layer 20C may be sequentially deposited over the insulating layer 42 and the bottom gate electrode 15 as continuous material layers. The continuous bottom gate dielectric layer 10C may be formed by deposition of at least one gate dielectric material. The gate dielectric material may include, but is not limited to, silicon oxide, silicon oxynitride, a dielectric metal oxide (such as aluminum oxide, hafnium oxide, yttrium oxide, lanthanum oxide, etc.), or a stack thereof. Other suitable dielectric materials are within the contemplated scope of disclosure. The gate dielectric material may be deposited by atomic layer deposition or chemical vapor deposition. The thickness of the continuous bottom gate dielectric layer 10C may be in a range from 1 nm to 12 nm, such as from 2 nm to 6 nm, although lesser and greater thicknesses may also be used. The continuous bottom gate dielectric layer 10C may be annealed at an elevated temperature to enhance electrical properties, such as reduction of surface states. The elevated temperature may be in a range from 300 degrees Celsius to 700 degrees Celsius, such as from 350 degrees Celsius to 600 degrees Celsius, and/or from 400 degrees Celsius to 500 degrees Celsius. In one embodiment, the elevated temperature may be higher than 400 degrees Celsius. The duration of the anneal process may be in a range from 10 minutes to 240 minutes, such as from 20 minutes to 120 minutes, although shorter and longer durations may also be employed. An anneal process at a temperature of 400 degrees Celsius or higher can provide enhanced crystallization of the material of the continuous bottom gate dielectric layer 10C compared to an anneal process below 400 degrees Celsius.

The continuous dielectric diffusion barrier liner 12C includes a dielectric material that may block out-diffusion of metallic elements within the continuous active layer 20C. For example, the continuous active layer 20C may include a semiconducting metal oxide material including at least two metallic elements such as indium gallium zinc oxide (IGZO), indium tungsten oxide, indium zinc oxide, indium tin oxide, gallium oxide, indium oxide, doped zinc oxide, doped indium oxide, doped cadmium oxide, and various other doped variants derived therefrom. In this embodiment, at least one metallic element such as indium within the semiconducting metal oxide material of the continuous active layer 20C may have a high bulk diffusion rate, and may out-diffuse at a faster out-diffusion rate than other metallic elements within the continuous active layer 20C during an anneal process that may be performed after formation of the continuous active layer 20C. The dielectric material of the continuous dielectric diffusion barrier liner 12C may suppress the out-diffusion of the at least one metallic element having the high bulk diffusion rate, and preserve the stoichiometry of the semiconducting metal oxide material within the continuous active layer 20C throughout the anneal process. In one embodiment, the continuous dielectric diffusion barrier liner 12C may be formed as a compositionally graded material layer having a vertical compositional gradient, and/or may be formed as a multilayer stack including at least two dielectric layers having different material compositions.

The continuous active layer 20C may be deposited over the continuous dielectric diffusion barrier liner 12C. In one embodiment, the semiconducting material includes a material providing electrical conductivity in a range from 1.0 S/m to $1.0 \times 10^5$ S/m upon suitable doping with electrical dopants (which may be p-type dopants or n-type dopants). Exemplary semiconducting materials that may be used for the continuous active layer include, but are not limited to, indium gallium zinc oxide (IGZO), indium tungsten oxide, indium zinc oxide, indium tin oxide, gallium oxide, indium oxide, doped zinc oxide, doped indium oxide, doped cadmium oxide, and various other doped variants derived therefrom. Other suitable semiconducting materials are within the contemplated scope of disclosure. In one embodiment, the semiconducting material of the continuous active layer 20C may include indium gallium zinc oxide.

The continuous active layer 20C may include a polycrystalline semiconducting material, or an amorphous semiconducting material that may be subsequently annealed into a polycrystalline semiconducting material having a greater average grain size. The continuous active layer 20C may be deposited by physical vapor deposition although other suitable deposition processes may be used. The thickness of the continuous active layer 20C may be in a range from 1 nm to 100 nm, such as from 2 nm to 50 nm and/or from 4 nm to 15 nm, although lesser and greater thicknesses may also be used. The continuous active layer 20C may be annealed at an elevated temperature to enhance electrical properties, for example, through reduction of surface states and increase in the average grain size. The elevated temperature may be in a range from 250 degrees Celsius to 400 degrees Celsius, such as from 300 degrees Celsius to 375 degrees Celsius. In one embodiment, the elevated temperature may be lower than 350 degrees Celsius. The duration of the anneal process may be in a range from 10 minutes to 240 minutes, such as from 20 minutes to 120 minutes, although shorter and longer durations may also be employed. Generally, performing two separate anneal processes for the material of the continuous bottom gate dielectric layer 10C and for the material of the continuous active layer 20C allows enhancement of the electrical properties of the material of the continuous bottom gate dielectric layer 10C prior to deposition the continuous active layer 20C (thus, without temperature limitation imposed by diffusion of the material of the continuous active layer 10C), for example, at a temperature greater than 400 degrees Celsius, while limiting the anneal temperature for the material of the continuous active layer 20C to a temperature that does not induce significant indium outdiffusion (such as an anneal temperature less than 350 degrees Celsius). In one embodiment, a first anneal process employed to anneal the continuous bottom gate dielectric layer 10C prior to deposition of the continuous active layer 20C can be performed at a first temperature that is higher than 400 degrees Celsius, and a second anneal process employed to anneal the continuous active layer 20C can be performed at a second anneal temperature that is lower than 350 degrees Celsius.

According to an aspect of the present disclosure, the material of the continuous dielectric diffusion barrier liner 12C may be selected to provide effective diffusion blocking for the metallic elements within the continuous active layer 20C. In one embodiment, the continuous active layer 20C comprises, and/or consists essentially of, a compound semiconductor material including at least two metallic elements and oxygen. In one embodiment, the continuous dielectric diffusion barrier liner 12C may be formed by deposition of an oxide material including at least one metallic element selected from the at least two metallic elements.

In one embodiment, the continuous active layer 20C comprises an indium-containing semiconducting metal oxide material, and the continuous dielectric diffusion barrier liner 12C comprises, and/or consists essentially of, a dielectric material that is free of indium, i.e., includes indium at an atomic concentration that is less than 10 parts per million, such as less than 1 part per million.

In one embodiment, the continuous active layer 20C comprises an indium-containing semiconducting metal oxide material, and the continuous dielectric diffusion barrier liner 12C comprises, and/or consists essentially of, a material selected from a metal oxide material excluding indium and including at least one metal different from indium and present within the indium-containing semiconducting metal oxide material of the continuous active layer 20C. In one embodiment, the continuous dielectric diffusion barrier liner 12C comprises, and/or consists essentially of, a material selected from gallium oxide, zinc oxide, and gallium zinc oxide.

In one embodiment, the continuous active layer 20C comprises an indium-containing semiconducting metal oxide material, and the continuous dielectric diffusion barrier liner 12C comprises, and/or consists essentially of, a metal oxide of an alkaline earth metal. For example, the continuous dielectric diffusion barrier liner 12C comprises, and/or consists essentially of, CaO or SrO.

In one embodiment, the continuous active layer 20C comprises an indium-containing semiconducting metal oxide material, and the continuous dielectric diffusion barrier liner 12C comprises, and/or consists essentially of, a dielectric oxide of a transition metal or aluminum oxide. For example, the continuous dielectric diffusion barrier liner 12C comprises, and/or consists essentially of, aluminum oxide, chromium oxide, titanium oxide, yttrium oxide, zirconium oxide, lanthanum oxide, hafnium oxide, tantalum oxide, a compound thereof, a homogenized mixture thereof, and a layer stack thereof.

In one embodiment, the continuous active layer 20C comprises an indium-containing semiconducting metal oxide material, and the continuous dielectric diffusion barrier liner 12C comprises, and/or consists essentially of, a material selected from silicon nitride and silicon oxide.

Generally, the material of the continuous dielectric diffusion barrier liner 12C may be deposited by atomic layer deposition, physical vapor deposition, chemical vapor deposition, or a combination thereof. In one embodiment, the continuous dielectric diffusion barrier liner 12C may include a layer stack of any two or more of above-listed materials for the continuous diffusion barrier liner 12C. The thickness of the continuous dielectric diffusion barrier liner 12C may be in a range from 0.5 nm to 30 nm, such as from 3 nm to 10 nm, although lesser and greater thicknesses may also be used.

Referring to FIGS. 6A-6C, a photoresist layer (not shown) may be applied over the continuous active layer 20C, and may be lithographically patterned to form discrete patterned photoresist material portions straddling a respective bottom gate electrode 15 along the first horizontal direction hd1. In one embodiment, each patterned portion of the photoresist layer may have a horizontal cross-sectional shape of a rectangle or a rounded rectangle. The pattern in the photoresist layer may be transferred through the continuous active layer 20C, the continuous dielectric diffusion barrier liner 12C, and the continuous bottom gate dielectric layer 10C by performing an anisotropic etch process. Each patterned portion of the continuous active layer 20C comprises an active layer 20. Each patterned portion of the continuous dielectric diffusion barrier liner 12C comprises a dielectric diffusion barrier liner 12. Each patterned portion of the continuous bottom gate dielectric layer 10C comprises a bottom gate dielectric 10.

In one embodiment, each active layer 20 may have a horizontal cross-sectional shape of a rectangle or a rounded rectangle. In one embodiment, each active layer 20 may have a lateral dimension along the first horizontal direction hd1 in a range from 60 nm to 1,000 nm, such as from 100 nm to 300 nm, although lesser and greater lateral dimensions may also be used. In one embodiment, each active layer 20 may have a lateral dimension along the second horizontal direction hd2 in a range from 20 nm to 500 nm, such as from 40 nm to 250 nm, although lesser and greater lateral dimensions may also be used. The ratio of the lateral dimension along the first horizontal direction hd1 to the lateral dimension along the second horizontal direction hd2 in each active layer 20 may be in a range from 0.5 to 4, such as from 1 to 2, although lesser and greater ratios may also be used. Generally, a vertical stack of a bottom gate electrode 15, a bottom gate dielectric 10, a dielectric diffusion barrier liner 12, and an active layer 20 may be formed over lower-level dielectric layers (601, 610, 620) that overlies a substrate 8. The sidewalls of the bottom gate dielectric 10, the dielectric diffusion barrier liner 12, and the active layer 20 may be vertically coincident, i.e., may be located within same vertical planes. The photoresist layer may be subsequently removed, for example, by ashing.

Figure 7A:
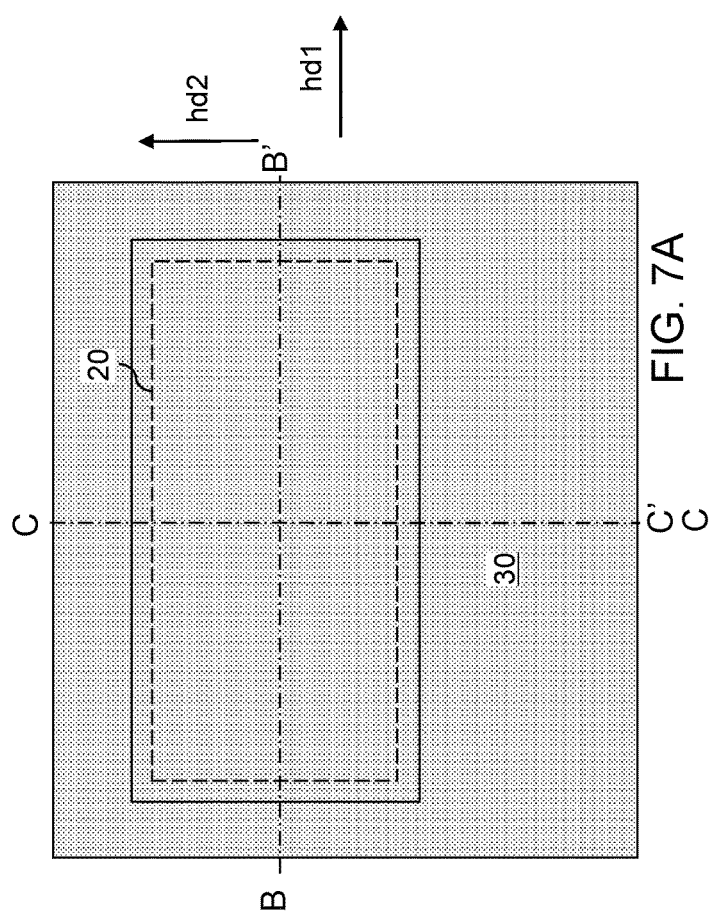
FIG. 7A is a top-down view of a region of the first exemplary structure after formation of a capping dielectric diffusion barrier liner and a top gate dielectric according to the first embodiment of the present disclosure.
Figure 7C:
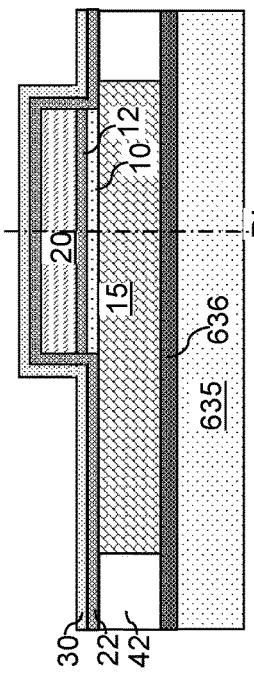
FIG. 7C is a vertical cross-sectional view of the first exemplary structure along the vertical plane C-C' of FIG. 7A.
Figure 7B:
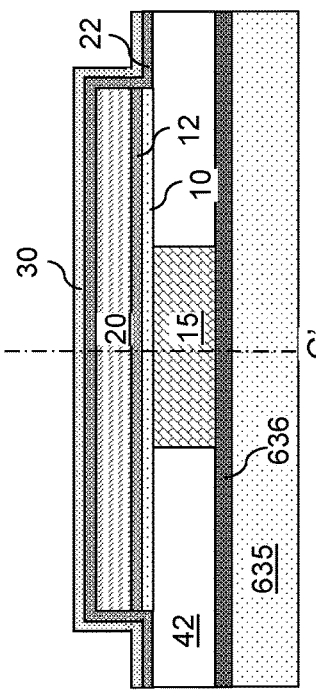
FIG. 7B is a vertical cross-sectional view of the first exemplary structure along the vertical plane B-B' of FIG. 7A.

Referring to FIGS. 7A-7C, an optional capping dielectric diffusion barrier liner 22 and a top gate dielectric 30 may be formed over each layer stack of a bottom gate dielectric 10, a dielectric diffusion barrier liner 12, and an active layer 20.

The optional capping dielectric diffusion barrier liner 22, if present, comprises, and/or consists essentially of, any material that may be used for the capping dielectric diffusion barrier liner 22. The material of the capping dielectric diffusion barrier liner 22 may be the same as, or may be different from, the material of the dielectric diffusion barrier liner 12. The dielectric material of the capping dielectric diffusion barrier liner 22 is herein referred to as a capping dielectric metal oxide material.

According to an aspect of the present disclosure, the material of the capping dielectric diffusion barrier liner 22 may be selected to provide effective diffusion blocking for the metallic elements within the active layer 20. In one embodiment, the active layer 20 comprises, and/or consists essentially of, a compound semiconductor material including at least two metallic elements and oxygen. In one embodiment, the capping dielectric diffusion barrier liner 22 may be formed by deposition of an oxide material including at least one metallic element selected from the at least two metallic elements. The capping dielectric diffusion barrier liner 22 comprises, and/or consists essentially of, a capping dielectric metal oxide material contacting a portion of a top surface of the active layer 20 that overlies the bottom gate electrode 15. Each surface of the active layer 20 may be in contact with a respective surface selected from a top surface of the dielectric diffusion barrier liner 12 and surfaces of the capping dielectric diffusion barrier liner 22.

In one embodiment, the active layer 20 comprises an indium-containing semiconducting metal oxide material, and the capping dielectric diffusion barrier liner 22 comprises, and/or consists essentially of, a dielectric material that is free of indium, i.e., includes indium at an atomic concentration that is less than 10 parts per million, such as less than 1 part per million.

In one embodiment, the active layer 20 comprises an indium-containing semiconducting metal oxide material, and the capping dielectric diffusion barrier liner 22 comprises, and/or consists essentially of, a material selected from a metal oxide material excluding indium and including at least one metal different from indium and present within the indium-containing semiconducting metal oxide material of the active layer 20. In one embodiment, the capping dielectric diffusion barrier liner 22 comprises, and/or consists essentially of, a material selected from gallium oxide, zinc oxide, and gallium zinc oxide.

In one embodiment, the active layer 20 comprises an indium-containing semiconducting metal oxide material, and the capping dielectric diffusion barrier liner 22 comprises, and/or consists essentially of, a metal oxide of an alkaline earth metal. For example, the capping dielectric diffusion barrier liner 22 comprises, and/or consists essentially of, CaO or SrO.

In one embodiment, the active layer 20 comprises an indium-containing semiconducting metal oxide material, and the capping dielectric diffusion barrier liner 22 comprises, and/or consists essentially of, a dielectric oxide of a transition metal or aluminum oxide. For example, the capping dielectric diffusion barrier liner 22 comprises, and/or consists essentially of, aluminum oxide, chromium oxide, titanium oxide, yttrium oxide, zirconium oxide, lanthanum oxide, hafnium oxide, tantalum oxide, a compound thereof, a homogenized mixture thereof, and a layer stack thereof.

In one embodiment, the active layer 20 comprises an indium-containing semiconducting metal oxide material, and the capping dielectric diffusion barrier liner 22 comprises, and/or consists essentially of, a material selected from silicon nitride and silicon oxide.

Generally, the material of the capping dielectric diffusion barrier liner 22 may be deposited by atomic layer deposition, physical vapor deposition, chemical vapor deposition, or a combination thereof. The thickness of the capping dielectric diffusion barrier liner 22 may be in a range from 0.5 nm to 30 nm, such as from 3 nm to 10 nm, although lesser and greater thicknesses may also be used.

The top gate dielectric 30 may be formed by deposition of at least one top gate dielectric material. The at least one top gate dielectric material may include, but is not limited to, silicon oxide, silicon nitride, silicon oxynitride, a dielectric metal oxide (such as aluminum oxide, hafnium oxide, yttrium oxide, lanthanum oxide, etc.), or a stack thereof. Other suitable dielectric materials are within the contemplated scope of disclosure. The at least one top gate dielectric material may be deposited by atomic layer deposition or chemical vapor deposition. The thickness of the top gate dielectric 30 may be in a range from 1 nm to 12 nm, such as from 2 nm to 6 nm, although lesser and greater thicknesses may also be used. In case an anneal process is performed to anneal the material of the top gate dielectric 30, the elevated temperature of the anneal process can be less than 350 degrees Celsius to limit diffusion of indicum from the active layer 20.

Referring to FIGS. 8A-8C, at least one conductive material layer may be deposited over the top gate dielectric 30. The at least one conductive material layer may include at least one metallic material and/or at least one heavily doped semiconductor material (such as heavily doped polysilicon). A photoresist layer (not shown) may be applied over the at least one conductive material layer, and may be lithographically patterned to form discrete photoresist material portions. The pattern in the photoresist material portions may be transferred through the at least one conductive material layer by performing an anisotropic etch process. In one embodiment, the anisotropic etch process may be selective to the material of the top gate dielectric 30. Each patterned portion of the at least one conductive material layer constitutes a top gate electrode 35. The photoresist layer may be subsequently removed, for example, by ashing. The top gate electrode 35 straddles the active layer 20 along the second horizontal direction hd2. The height of the top gate electrode 35, as measured in a region overlying the active layer 20 between a bottom surface and a top surface of the top gate electrode 35, may be in a range from 50 nm to 300 nm, such as from 100 nm to 200 nm, although lesser and greater heights may also be used.

Referring to FIGS. 9A-9C, a dielectric layer 48 may be deposited over the top gate electrode 35 and the top gate dielectric 30. The dielectric layer 48 is also referred to as an electrode-level dielectric layer. The dielectric layer 48 includes a dielectric material such as undoped silicate glass, a doped silicate glass, organosilicate glass, or a stack thereof. Optionally, the dielectric layer 48 may be planarized to provide a flat top surface. The dielectric material of the dielectric layer 48 may be planarized so that a planarized horizontal top surface of the dielectric layer 48 is formed within the horizontal plane including the top surface of the top gate electrode 35. The set of the insulating layer 42 and the dielectric layer 48 is herein referred to as a thin-film-transistor-level (TFT-level) dielectric layer 40, i.e., a dielectric layer that is located at the level of thin film transistors.

Referring to FIGS. 10A-10C, a photoresist layer (not shown) may be applied over the TFT-level dielectric layer 40, and may be lithographically patterned to form discrete openings therein. The pattern of the discrete openings in the photoresist layer may be transferred through the dielectric layer 48, the top gate dielectric 30, and the capping dielectric diffusion barrier liner 22 by at least one etch process to form a source cavity 51, a drain cavity 59, and a bottom gate contact via cavity 19. The at least one etch process may comprise a first anisotropic etch process that etches the material of the dielectric layer 48 selective to the material of the top gate dielectric 30, an isotropic etch process or a second anisotropic etch process that etches the material of the top gate dielectric 30 selective to the material of the capping dielectric diffusion barrier liner 22, and an isotropic etch process or a third anisotropic etch process that etches the material of the capping dielectric diffusion barrier liner 22 selective to the material of the active layer 20.

The source cavity 51 and the drain cavity 59 may be formed at opposite ends of the active layer 20, and may be laterally spaced from each other along the first horizontal direction hd1. In one embodiment, an end sidewall of the active layer 20 laterally extending along the second horizontal direction hd2 and a pair of sidewall segments of the active layer 20 laterally extending along the first horizontal direction hd1 may be physically exposed at the bottom of each of the source cavity 51 and the drain cavity 59. A rectangular portion of the top surface of the active layer 20 may be physically exposed at the bottom of each of the source cavity 51 and the drain cavity 59. A top surface of the bottom gate electrode 15 may be physically exposed at the bottom of the bottom gate contact via cavity 19. The photoresist layer may be subsequently removed, for example, by ashing.

Referring to FIGS. 11A-11C, at least one conductive material may be deposited in the cavities (51, 19, 59) and over the TFT-level dielectric layer 40. The at least one conductive material may include a metallic liner material and a metallic fill material. The metallic liner material may include a conductive metallic nitride or a conductive metallic carbide such as TiN, TaN, WN, TiC, TaC, and/or WC. The metallic fill material may include W, Cu, Al, Co, Ru, Mo, Ta, Ti, alloys thereof, and/or combinations thereof. Other suitable materials within the contemplated scope of disclosure may also be used.

Excess portions of the at least one conductive material may be removed from above the horizontal plane including the top surface of the TFT-level dielectric layer 40 by a planarization process, which may use a CMP process and/or a recess etch process. Other suitable planarization processes may be used. Each remaining portion of the at least one conductive material filling a source cavity 51 constitutes a source electrode 52. Each remaining portion of the at least one conductive material filling a drain cavity 59 constitutes a drain electrode 56. Each remaining portion of the at least one conductive material filling a bottom gate contact via cavity 19 constitutes a backside electrode contact via structure 18, which contacts a top surface of the bottom gate electrode 15.

In one embodiment, each source electrode 52 may include a source metallic liner 53 that is a remaining portion of the metallic liner material, and a source metallic fill material portion 54 that is a remaining portion of the metallic fill material. Each drain electrode 56 may include a drain metallic liner 57 that is a remaining portion of the metallic liner material, and a drain metallic fill material portion 58 that is a remaining portion of the metallic fill material. Each backside electrode contact via structure 18 may include a bottom gate contact metallic liner 16 that is a remaining portion of the metallic liner material, and a bottom gate contact metallic fill material portion 17 that is a remaining portion of the metallic fill material.

The active layer 20 and a set of electrode structures (52, 15, 35, 56) may be formed within a TFT-level dielectric layer 40. Top surfaces of the source electrode 52, the drain electrode 56, the top gate electrode 35, and the backside electrode contact via structure 18 may be located within (i.e., may be co-planar with) a horizontal plane including a top surface of the TFT-level dielectric layer 40.

Generally, the source electrode 52 and the drain electrode 56 may be formed through the capping dielectric diffusion barrier liner 22 directly on end portions of the active layer 20. The capping dielectric diffusion barrier liner 22 may contact sidewalls of the bottom gate dielectric 10, sidewalls of the dielectric diffusion barrier liner 12, and a top surface of the dielectric diffusion barrier liner 12.

Referring to FIGS. 12A-12C, a first alternative configuration of the first exemplary structure may be derived from the first exemplary structure illustrated in FIGS. 11A-11C by removing unmasked portions of the top gate dielectric 30 after patterning the top gate electrode 35 at the processing steps of FIGS. 8A-8C. The removal of unmasked portions of the top gate dielectric 30 may be performed selective to the material of the capping dielectric diffusion barrier liner 22. The photoresist layer may be subsequently removed, and the processing steps of FIGS. 9A-11C may be subsequently performed to provide the first alternative configuration of the first exemplary structure illustrated in FIGS. 12A-12C.

Referring to FIGS. 13A-13C, a second alternative configuration of the first exemplary structure may be derived from the first exemplary structure illustrated in FIGS. 11A-11C by removing unmasked portions of the top gate dielectric 30 and unmasked portions of the capping dielectric diffusion barrier liner 22 after patterning the top gate electrode 35 at the processing steps of FIGS. 8A-8C. The removal of unmasked portions of the top gate dielectric 30 may be performed selective to the material of the capping dielectric diffusion barrier liner 22. The removal of unmasked portions of the capping dielectric diffusion barrier liner 22 may be performed selective to the material of the active layer 20. The photoresist layer may be subsequently removed, and the processing steps of FIGS. 9A-11C may be subsequently performed to provide the second alternative configuration of the first exemplary structure illustrated in FIGS. 12A-12C.

Referring to FIGS. 14A-14C, a second exemplary structure according to a second embodiment of the present disclosure may be derived from the first exemplary structure of FIGS. 6A-6C by forming a top gate dielectric 30 by performing a processing step of FIGS. 7A-7C without forming the optional capping dielectric diffusion barrier liner 22. Thus, the top gate dielectric 30 may be formed directly on physically exposed surfaces of the active layer 20, sidewalls of the dielectric diffusion barrier liner 12, sidewalls of the bottom gate dielectric 10, and on top surfaces of the bottom gate electrode 15 and the insulating layer 42.

Referring to FIGS. 15A-15C, the processing steps of FIGS. 8A-8C may be performed to form a top gate electrode 35 over each active layer 20 on a top surface of the top gate dielectric 30.

Figure 16A:
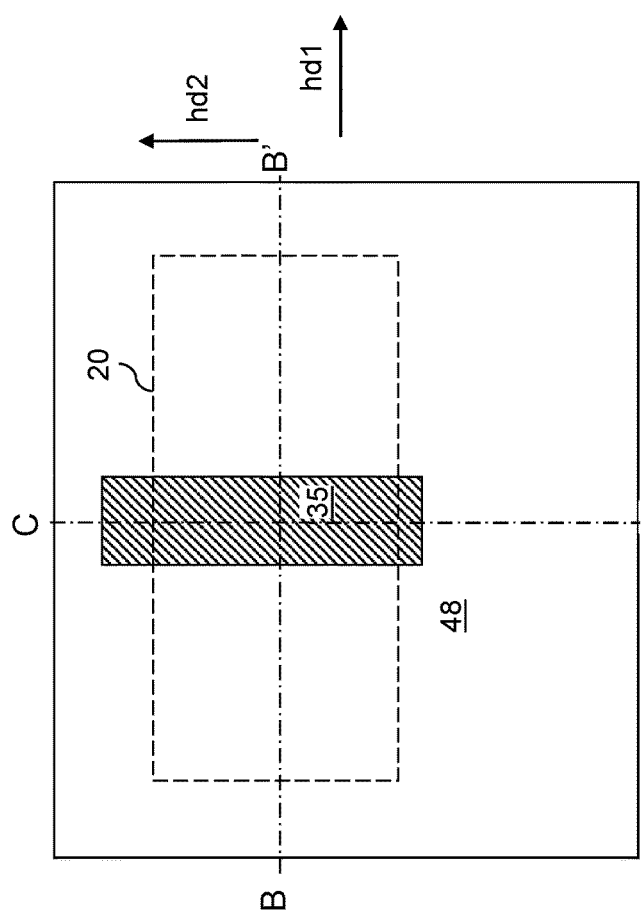
FIG. 16A is a top-down view of a region of a second exemplary structure after formation of a dielectric layer according to the second embodiment of the present disclosure.
Figure 16C:
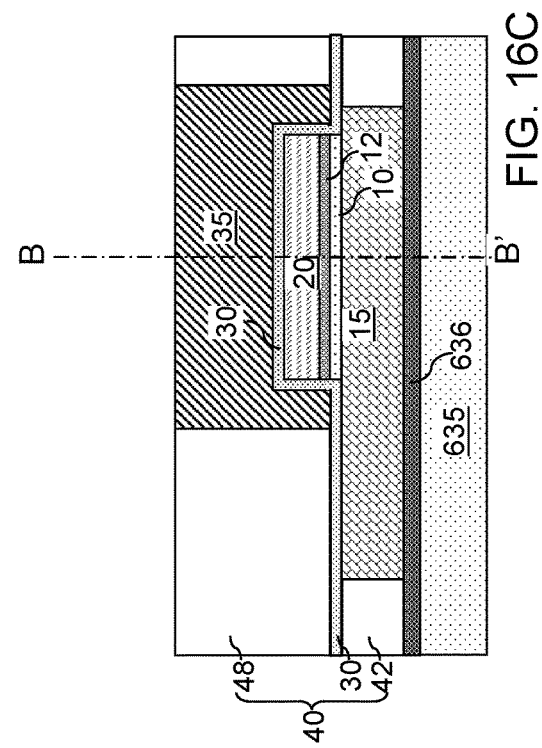
FIG. 16C is a vertical cross-sectional view of the second exemplary structure along the vertical plane C-C' of FIG. 16A.
Figure 16B:
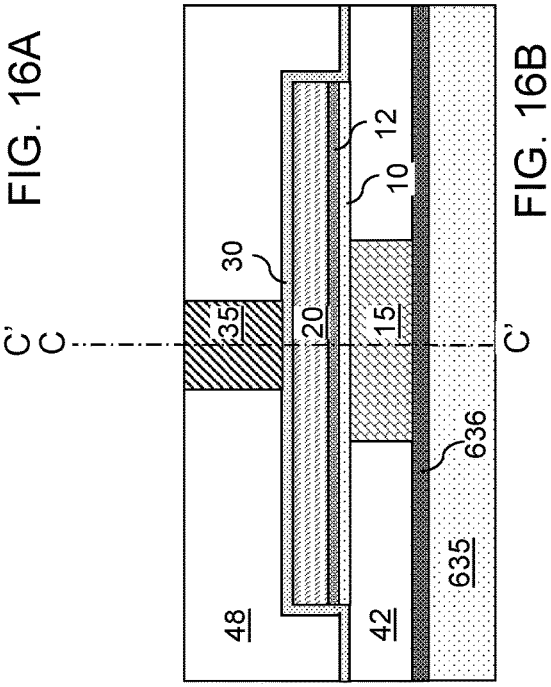
FIG. 16B is a vertical cross-sectional view of the second exemplary structure along the vertical plane B-B' of FIG. 16A.

Referring to FIGS. 16A-16C, the processing steps of FIGS. 9A-9C may be performed to form a dielectric layer 48 having a top surface within the horizontal plane including the top surface of the top gate electrode 35. The set of the insulating layer 42 and the dielectric layer 48 is herein referred to as a thin-film-transistor-level (TFT-level) dielectric layer 40, i.e., a dielectric layer that is located at the level of thin film transistors.

Referring to FIGS. 17A-17C, the processing steps of FIGS. 10A-10C may be performed to form a source cavity 51, a drain cavity 59, and a bottom gate contact via cavity 19 through the dielectric layer 48 and the top gate dielectric 30.

Referring to FIGS. 18A-18C, the processing steps of FIGS. 11A-11C may be performed to form a source electrode 52, a drain electrode 56, and a backside electrode contact via structure 18.

Figure 19C:
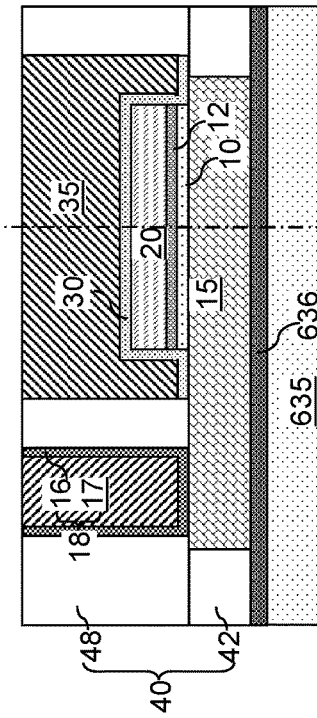
FIG. 19C is a vertical cross-sectional view of the second exemplary structure along the vertical plane C-C' of FIG. 19A.
Figure 19A:
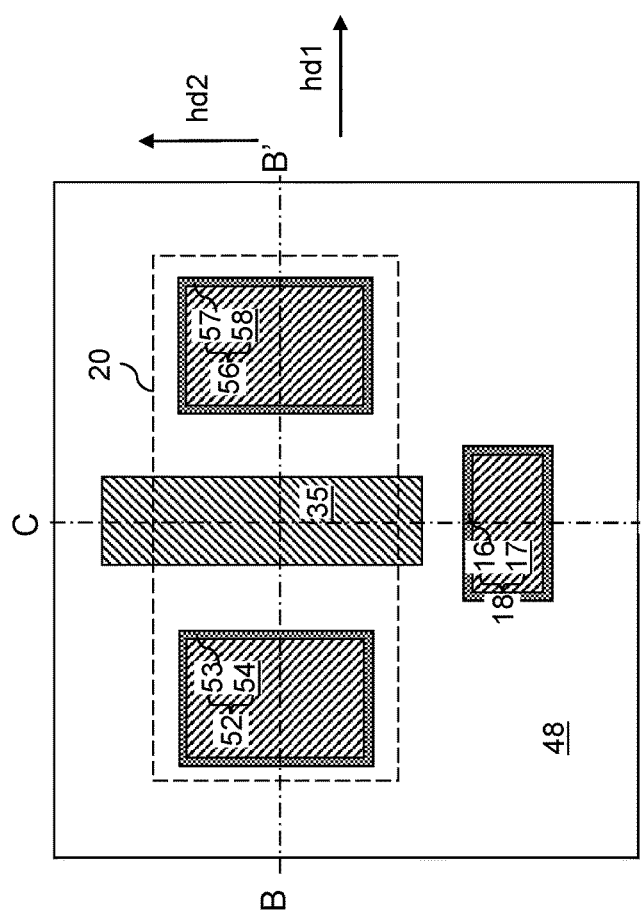
FIG. 19A is a top-down view of a region of a first alternative configuration of the second exemplary structure after formation of a source electrode, a drain electrode, and a backside electrode contact via structure according to the second embodiment of the present disclosure.
Figure 19B:
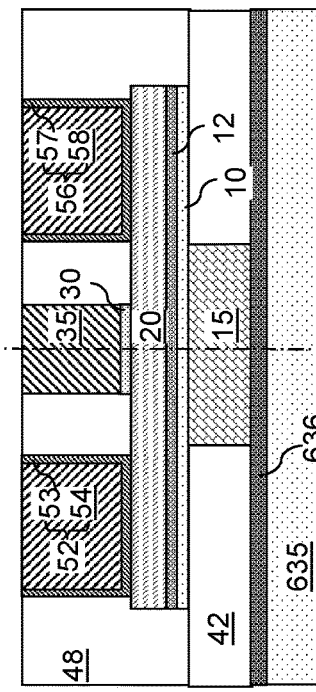
FIG. 19B is a vertical cross-sectional view of the second exemplary structure along the vertical plane B-B' of FIG. 19A.

Referring to FIGS. 19A-19C, an alternative configuration of the second exemplary structure may be derived from the second exemplary structure illustrated in FIGS. 18A-18C by removing unmasked portions of the top gate dielectric 30 after patterning the top gate electrode 35 at the processing steps of FIGS. 15A-15C. The removal of unmasked portions of the top gate dielectric 30 may be performed selective to the material of the active layer 20. The photoresist layer may be subsequently removed, and the processing steps of FIGS. 16A-18C may be subsequently performed to provide the alternative configuration of the second first exemplary structure illustrated in FIGS. 19A-19C.

Figure 20A:
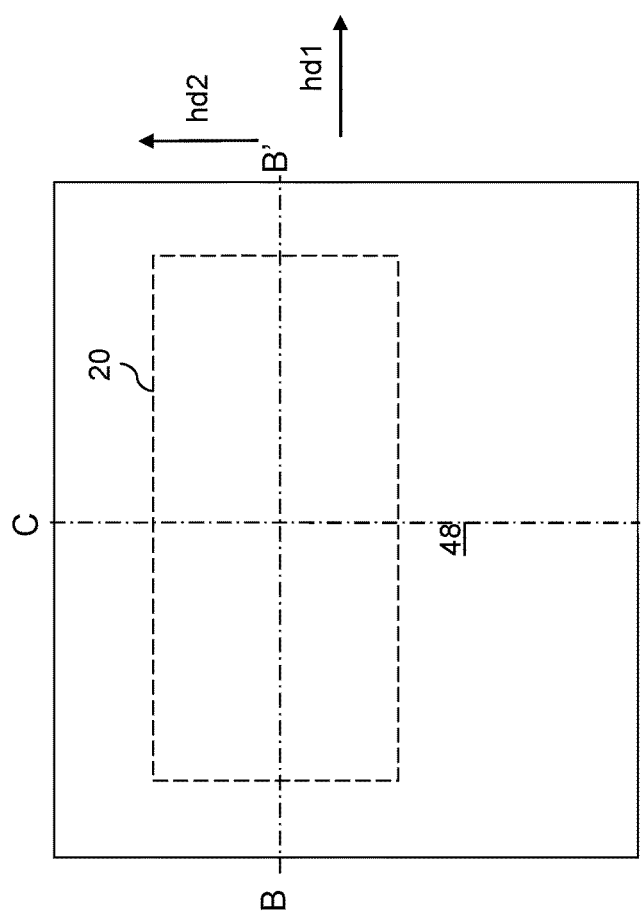
FIG. 20A is a top-down view of a region of a third exemplary structure after formation of a capping dielectric diffusion barrier liner according to a third embodiment of the present disclosure.
Figure 20C:
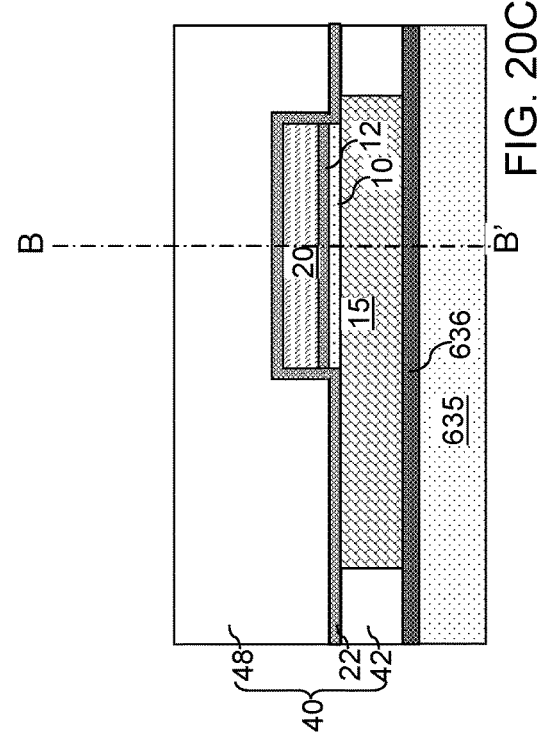
FIG. 20C is a vertical cross-sectional view of the third exemplary structure along the vertical plane C-C' of FIG. 20A.
Figure 20B:
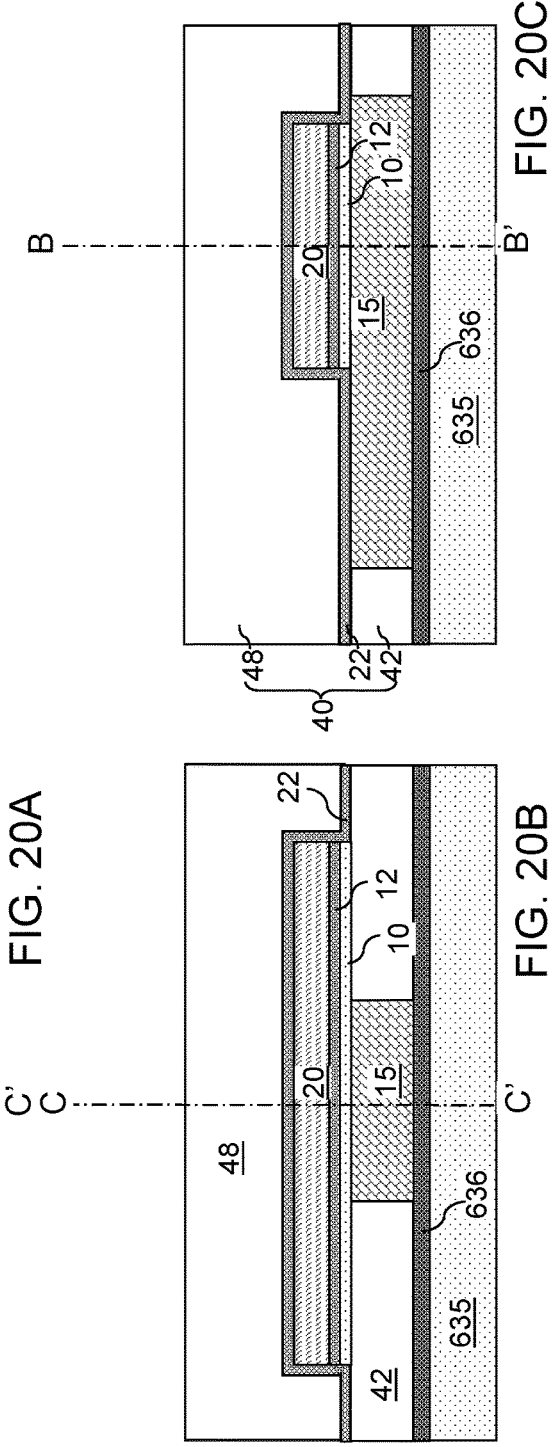
FIG. 20B is a vertical cross-sectional view of the third exemplary structure along the vertical plane B-B' of FIG. 20A.

Referring to FIGS. 20A-20C, a third exemplary structure according to a third embodiment of the present disclosure is illustrated. The third exemplary structure may be derived from the first exemplary structure illustrated in FIGS. 6A-6C by depositing a capping dielectric diffusion barrier liner 22 using a processing step of FIGS. 7A-7C, and by forming a dielectric layer 48 using the processing steps of FIGS. 9A-9C. Formation of a top gate dielectric or a top gate electrode is omitted.

Referring to FIGS. 21A-21C, the processing steps of FIGS. 10A-10C may be performed to form a source cavity 51, a drain cavity 59, and a bottom gate contact via cavity 19 through the dielectric layer 48 and the capping dielectric diffusion barrier liner 22.

Referring to FIGS. 22A-22C, the processing steps of FIGS. 11A-11C may be performed to form a source electrode 52, a drain electrode 56, and a backside electrode contact via structure 18.

Figure 23A:
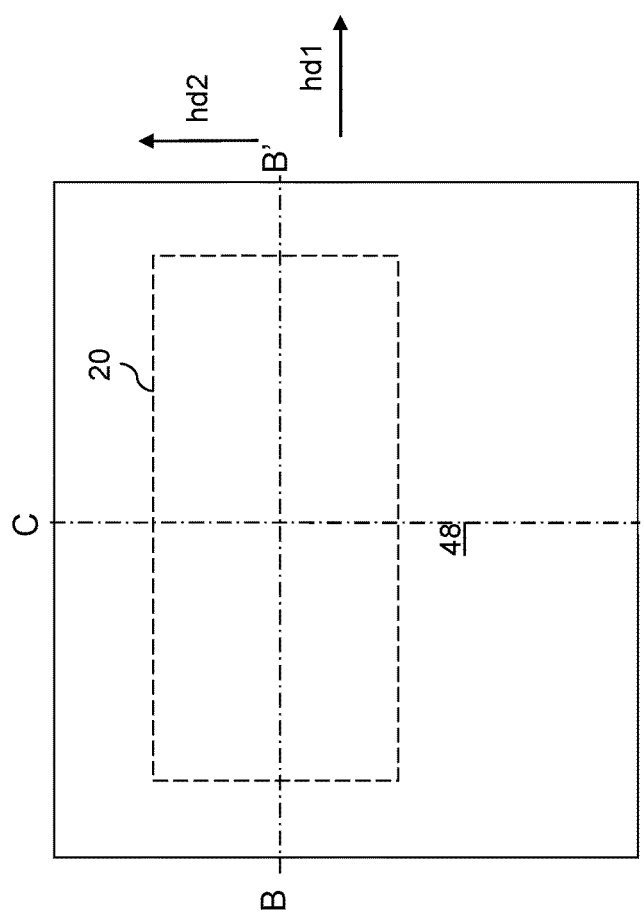
FIG. 23A is a top-down view of a region of a fourth exemplary structure after formation of a dielectric layer according to the fourth embodiment of the present disclosure.
Figure 23C:
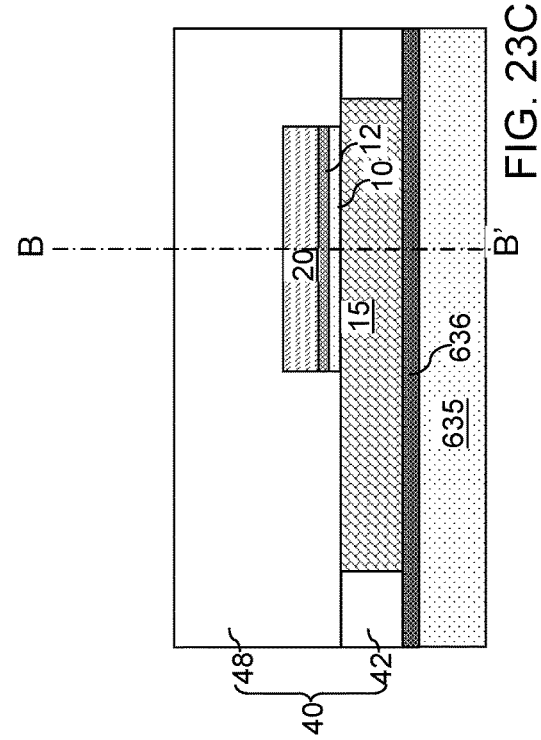
FIG. 23C is a vertical cross-sectional view of the fourth exemplary structure along the vertical plane C-C' of FIG. 23A.
Figure 23B:
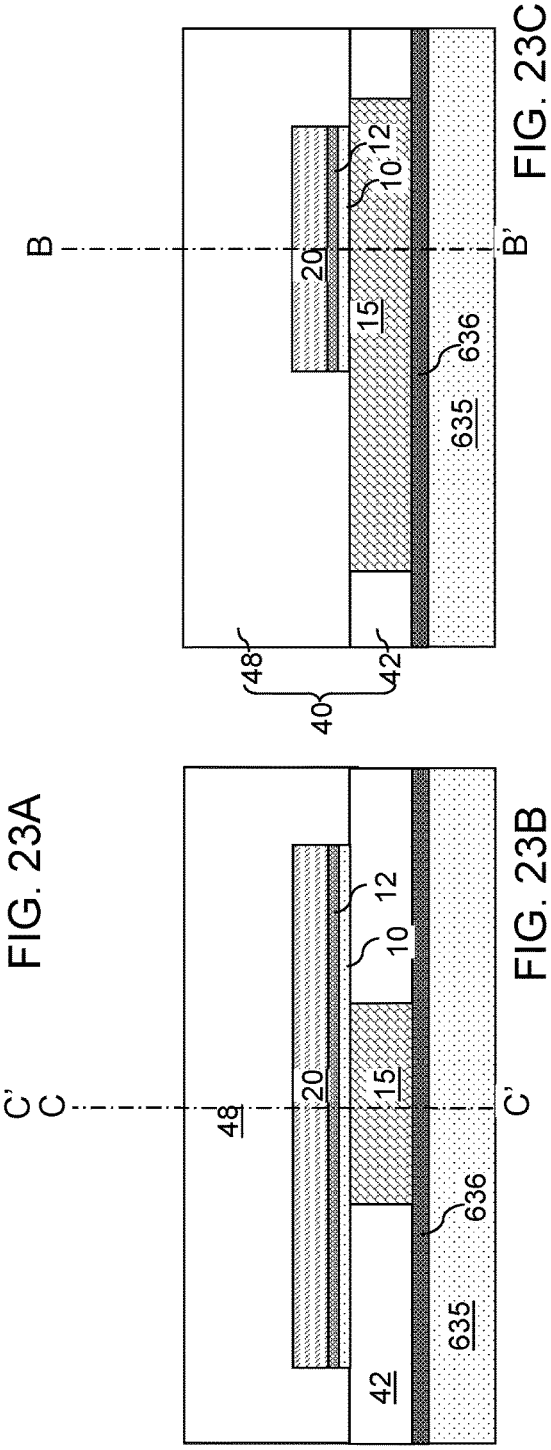
FIG. 23B is a vertical cross-sectional view of the fourth exemplary structure along the vertical plane B-B' of FIG. 23A.

Referring to FIGS. 23A-23C, a fourth exemplary structure according to a fourth embodiment of the present disclosure is illustrated. The fourth exemplary structure may be derived from the first exemplary structure illustrated in FIGS. 6A-6C by forming a dielectric layer 48 using the processing steps of FIGS. 9A-9C. The processing steps of FIGS. 7A-7C and 8A-8C are omitted. In other words, a capping dielectric diffusion barrier liner or a top gate dielectric is not formed.

Referring to FIGS. 24A-24C, the processing steps of FIGS. 10A-10C may be performed to form a source cavity 51, a drain cavity 59, and a bottom gate contact via cavity 19 through the dielectric layer 48.

Referring to FIGS. 25A-25C, the processing steps of FIGS. 11A-11C may be performed to form a source electrode 52, a drain electrode 56, and a backside electrode contact via structure 18.

Figure 26:
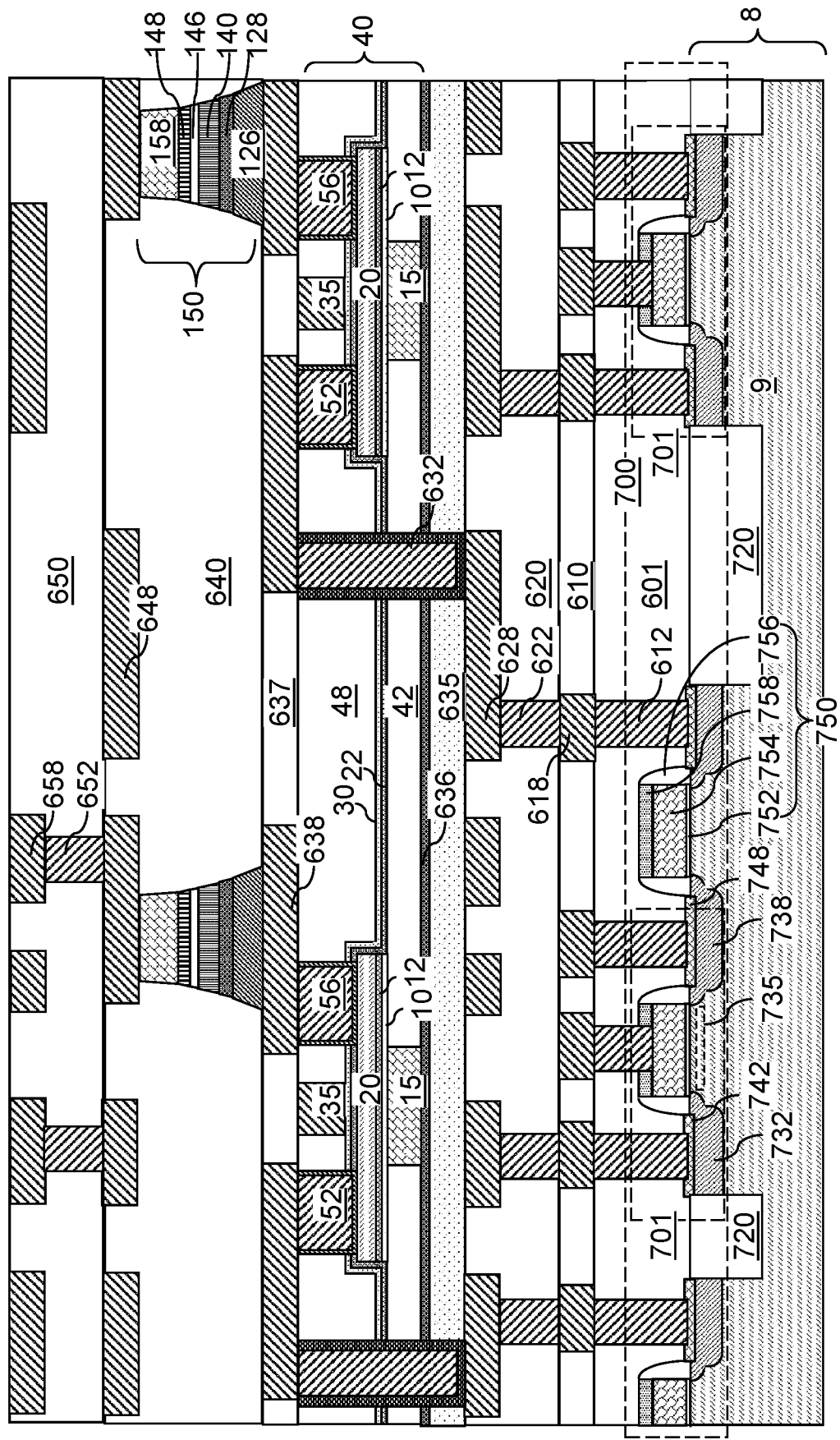
FIG. 26 is a vertical cross-sectional view of the exemplary structure after formation of memory cells according to an embodiment of the present disclosure.

Referring to FIG. 26, an exemplary structure is illustrated after formation of thin film transistors. The exemplary structure may be derived from the first exemplary structures illustrated in FIGS. 11A-13C, from the second exemplary structures illustrated in FIGS. 18A-19C, from the third exemplary structure illustrated in FIGS. 22A-22C, or from the fourth exemplary structure illustrated in FIGS. 25A-25C. For example, second metal via structures 632 may be formed through the TFT-level dielectric layer 40 and the insulating spacer layer 635 on a respective one of the second metal line structures 628 concurrent with, before, or after, formation of the source electrodes 52, the drain electrodes 56, the optional top gate electrodes 35, and the backside electrode contact via structures 18.

A dielectric layer, which is herein referred to as a third line-level dielectric layer 637, may be deposited over the TFT-level dielectric layer 40. Third metal line structures 638 may be formed in the third line-level dielectric layer 637 on a respective one of the metallic structures (52, 56, 35, 18) embedded within the TFT-level dielectric layer 40.

Additional metal interconnect structures embedded in additional dielectric layers may be subsequently formed over the thin film transistors and the third line-level dielectric layer 637. In an illustrative example, the dielectric layers may include, for example, a fourth interconnect-level dielectric layer 640, a fifth interconnect-level dielectric layer 650, etc. The additional metal interconnect structures may include third metal via structures (not illustrated) and fourth metal lines 648 embedded in the fourth interconnect-level dielectric layer 640, fourth metal via structures 652 and fifth metal line structures 658 embedded in the fifth interconnect-level dielectric layer 650, etc.

Optionally, memory cells 150 may be formed below, above, or at the same level as, the thin film transistors. In embodiments in which the thin film transistors are formed as a two-dimensional periodic array, the memory cells 150 may be formed as a two-dimensional periodic array of memory cells 150. Each memory cell 150 may comprises a magnetic tunnel junction, a ferroelectric tunnel junction, a phase change memory material, or a vacancy-modulated conductive oxide material portion. Further, each memory cell 150 may include a first electrode 126 including a metallic material, and a second electrode 158 including a metallic material and protecting an underlying data-storing portion of the memory cell 150. A memory element is provided between the first electrode 126 (i.e., bottom electrode) and the second electrode 158 (i.e., top electrode).

In an illustrative example, in embodiments in which the memory cell 150 includes a magnetic tunnel junction, the memory cell 150 may include a layer stack including, from bottom to top, a first electrode 126, a metallic seed layer 128 that facilitates crystalline growth of overlying material layers, a synthetic antiferromagnet (SAF) structure 140, a tunneling barrier layer 146, a free magnetization layer 148, and a second electrode 158. While the present disclosure is described using an embodiment in which the thin film transistors are used as access transistors for memory cells 150, embodiments are expressly contemplated herein in which the thin film transistors are used as logic devices, as components of a peripheral circuit for a memory array, or for any other semiconductor circuitry.

In one embodiment, the substrate 8 comprises a single crystalline silicon substrate. Lower-level dielectric layers (601, 610, 620) embedding lower-level metal interconnect structures (612, 618, 622, 628) may be located between the single crystalline silicon substrate and the insulating layer 42. Field effect transistors 701 including a respective portion of the single crystalline silicon substrate as a channel may be embedded within the lower-level dielectric layers (601, 610, 620), and may be electrically connected to at least one of the gate electrodes (15, 35), the source electrodes 52, and the drain electrodes 56.

Figure 27:
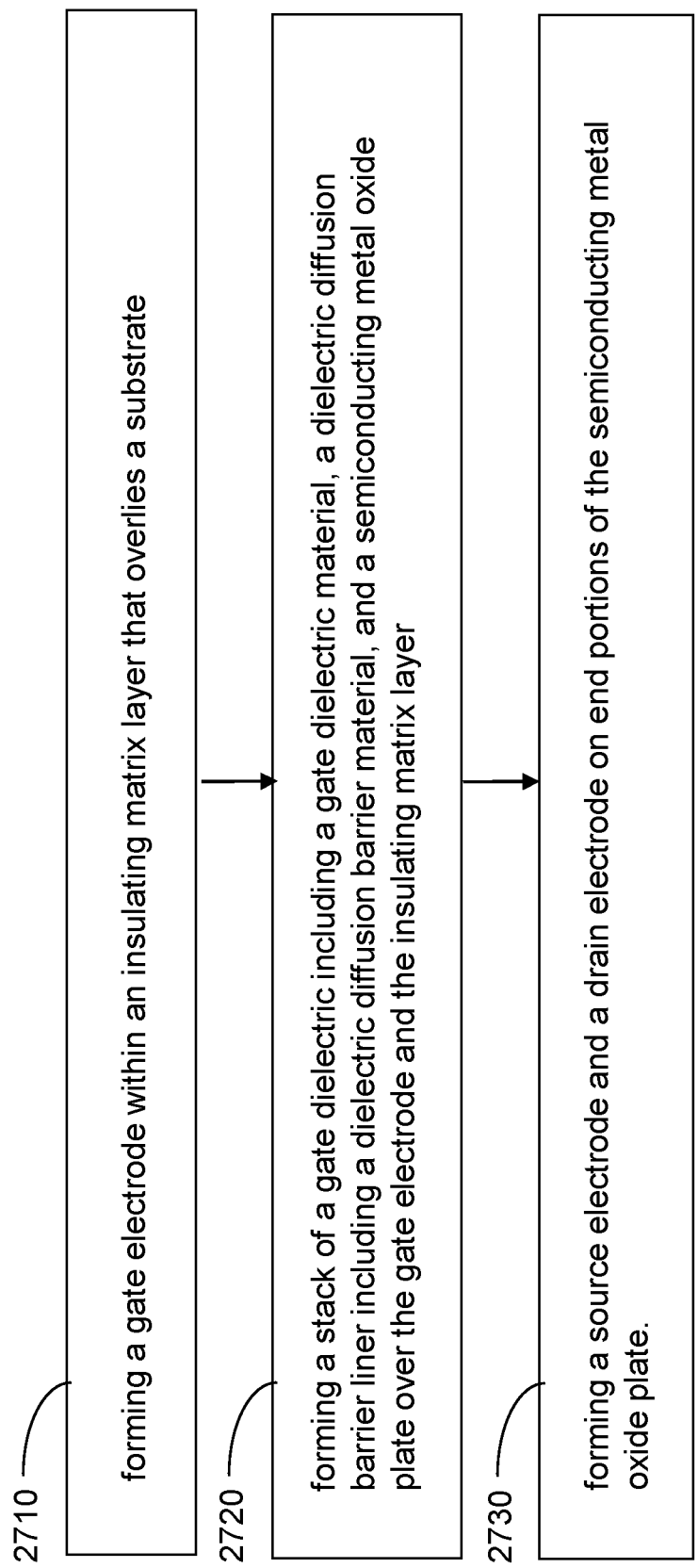
FIG. 27 is a flowchart that illustrates the general processing steps for manufacturing the semiconductor device of the present disclosure.

FIG. 27 is a flowchart that illustrates the general processing steps for manufacturing the semiconductor device of the present disclosure. Referring to step 2710 and FIGS. 1-4C, 12A-13C, 14A-14C, 19A-19C, 20A-20C, and 23A-23C, a gate electrode (such as a bottom gate electrode 15) may be formed within an insulating layer 42 that overlies a substrate 8. Referring to step 2720 and FIGS. 5A-6C, 12A-13C, 14A-14C, 19A-19C, 20A-20C, and 23A-23C, a stack of a gate dielectric (such as a bottom gate dielectric 10) including a gate dielectric material, a dielectric diffusion barrier liner 12 including a dielectric diffusion barrier material, and an active layer 20 may be formed over the gate electrode (such as the bottom gate electrode 15) and the insulating layer 42. The dielectric diffusion barrier material is different from the gate dielectric material, and is selected from a dielectric metal oxide material and a dielectric compound of silicon. Referring step 2730 and FIGS. 7A-11C, 12A-13C, 15A-18C, 19A-19C, 20A-22C, and 23A-25C, a source electrode 52 and a drain electrode 56 may be formed on end portions of the active layer 20.

Referring to all drawings and according to various embodiments of the present disclosure, a semiconductor device comprising a thin film transistor. The thin film transistor comprises: an insulating layer 42 embedding a gate electrode (such as a bottom gate electrode 15) and overlying a substrate 8; a stack of a gate dielectric (such as a bottom gate dielectric 10) including a gate dielectric material, a dielectric diffusion barrier liner 12 including a dielectric diffusion barrier material overlaying the gate dielectric, and an active layer 20 overlying a top surface of the gate electrode (such as the bottom gate electrode 15), wherein the dielectric diffusion barrier material is different from the gate dielectric material, and is selected from a dielectric metal oxide material and a dielectric compound of silicon; and a source electrode 52 and a drain electrode 56 contacting a respective portion of a top surface of the active layer 20.

In one embodiment, sidewalls of the gate dielectric (such as the bottom gate dielectric 10), sidewalls of the dielectric diffusion barrier liner 12, and sidewalls of the active layer 20 are vertically coincident with one another, i.e., located within common vertical planes.

In one embodiment, the active layer 20 comprises a compound semiconductor material including at least two metallic elements and oxygen; and the dielectric diffusion barrier liner 12 comprise an oxide material including at least one metallic element selected from the at least two metallic elements.

In one embodiment, the active layer 20 comprises an indium-containing semiconducting metal oxide material; and the dielectric diffusion barrier liner 12 comprises a dielectric material that is free of indium, i.e., includes indium at an atomic concentration that is less than 10 parts per million, such as less than 1 part per million.

In one embodiment, the active layer 20 comprises indium gallium zinc oxide; and the dielectric diffusion barrier liner 12 comprises a material selected from gallium oxide, zinc oxide, and gallium zinc oxide.

In one embodiment, the dielectric diffusion barrier liner 12 comprises a metal oxide of an alkaline earth metal. In one embodiment, the dielectric diffusion barrier liner 12 comprises a dielectric oxide of a transition metal or aluminum oxide. In one embodiment, the dielectric diffusion barrier liner 12 comprises a material selected from silicon nitride and silicon oxide.

In one embodiment, the semiconductor device comprises a capping dielectric diffusion barrier liner 22 comprising a capping dielectric metal oxide material and contacting a portion of a top surface of the active layer 20 that overlies the gate electrode (such as the bottom gate electrode 15). In one embodiment, each surface of the active layer 20 may be in contact with a respective surface selected from a top surface of the dielectric diffusion barrier liner 12, surfaces of the source electrode 52, surfaces of the drain electrode 56, and surfaces of the capping dielectric diffusion barrier liner 22.

In one embodiment, the source electrode 52 contacts a first sidewall of the gate dielectric (such as the bottom gate dielectric 10) and a first sidewall of the dielectric diffusion barrier liner 12; and the drain electrode 56 contacts a second sidewall of the gate dielectric and a second sidewall of the dielectric diffusion barrier liner 12.

In one embodiment, the substrate 8 comprises a single crystalline silicon substrate; and lower-level dielectric layers (601, 610, 620) embedding lower-level metal interconnect structures (612, 618, 622, 628) are located between the single crystalline silicon substrate and the insulating layer 42. Field effect transistors 701 including a respective portion of the single crystalline silicon substrate as a channel may be embedded within the lower-level dielectric layers (601, 610, 620). The field effect transistors 701 may be electrically connected to at least one of the gate electrode (such as the bottom gate electrode 15 or a top gate electrode 35), the source electrode 52, and the drain electrode 56.

According to an aspect of the present disclosure, a semiconductor device may include: an insulating layer 42 embedding a bottom gate electrode 15 and overlying a substrate 8; a first stack of a bottom gate dielectric 10 including a first gate dielectric material, a dielectric diffusion barrier liner 12 including a dielectric diffusion barrier material overlaying the bottom gate dielectric, and an active layer 20 overlying a top surface of the bottom gate electrode 15, wherein the dielectric diffusion barrier material is different from the first gate dielectric material and is selected from a dielectric metal oxide material and a dielectric compound of silicon; a second stack of a top gate dielectric 30 and a top gate electrode 35 overlying the bottom gate electrode 15 and having an areal overlap with the bottom gate electrode in a plan view (i.e., a see-through view along a vertical direction that is perpendicular to a top surface of the substrate 8); and a source electrode 52 and a drain electrode 56 contacting a respective portion of a top surface of the active layer 20.

In one embodiment, the semiconductor device comprises a capping dielectric diffusion barrier liner 22 comprising a capping dielectric metal oxide material and contacting a top surface of the active layer 20 located between the source electrode 52 and the drain electrode 56, wherein each surface of the active layer 20 is in contact with a respective surface selected from a top surface of the dielectric diffusion barrier liner 12, a surface of the source electrode 52, a surface of the drain electrode 56, and surfaces of the capping dielectric diffusion barrier liner 22.

In one embodiment, the semiconductor device comprises: a dielectric layer (such as a dielectric layer 48) laterally surrounding the stack of the bottom gate dielectric 10 and the active layer 20; and a backside electrode contact via structure 18 contacting a top surface of the bottom gate electrode 15, wherein top surfaces of the source electrode 52, the drain electrode 56, the top gate electrode 35, and the backside contact via structure 18 are located within a horizontal plane including a top surface of the dielectric layer.

According to an aspect of the present disclosure, a method of forming a semiconductor device is provided. The method may include the operations of: forming a gate electrode within an insulating layer that overlies a substrate; forming a stack of a gate dielectric including a gate dielectric material, a dielectric diffusion barrier liner including a dielectric diffusion barrier material, and an active layer over the gate electrode and the insulating layer, wherein the dielectric diffusion barrier material is different from the gate dielectric material and is selected from a dielectric metal oxide material and a dielectric compound of silicon; and forming a source electrode and a drain electrode on end portions of the active layer.

In an embodiment, the method may further include the operations of: annealing the dielectric diffusion barrier liner at a first anneal temperature that is higher than 400 degrees Celsius; and annealing the active layer at a second anneal temperature that is lower than 350 degrees Celsius.

In an embodiment, the active layer may be formed by deposition and patterning of a compound semiconductor material including at least two metallic elements and oxygen; and the dielectric diffusion barrier liner may be formed by deposition and patterning of an oxide material including at least one metallic element selected from the at least two metallic elements.

In an embodiment, the active layer may include an indium-containing semiconducting metal oxide material; and the dielectric diffusion barrier liner may include a dielectric material that is free of indium.

In an embodiment, the method may further include the operation of forming a capping dielectric diffusion barrier liner that may include a capping dielectric metal oxide material on a top surface of the active layer, wherein the source electrode and the drain electrode are formed through the capping dielectric diffusion barrier liner directly on the active layer.

The various embodiments of the present disclosure may be used to reduce out-diffusion of a metallic element such as indium from the active layer 20 by providing metal-diffusion-resistant barrier structures or by providing at least one metal source structure (such as an indium source). The metal-diffusion-resistant barrier structures or the at least one metal source structure may include the dielectric diffusion barrier liner 12, the optional capping dielectric diffusion barrier liner 22, the source electrode 52, the drain electrode 56, and the optional top gate electrode 35. Blocking metal out-diffusion out of the active layer 20 prevents compositional changes within the active layer 20, and thus, may help maintain the device characteristics of the thin film transistor constant throughout the operational lifetime of the thin film transistor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
an insulating layer embedding a gate electrode and overlying a substrate;
a stack of a gate dielectric including a gate dielectric material, a dielectric diffusion barrier liner including a dielectric diffusion barrier material and overlying the gate dielectric, and an active layer overlying a top surface of the gate electrode, wherein the dielectric diffusion barrier material is different from the gate dielectric material and is selected from a dielectric metal oxide material and a dielectric compound of silicon;
a source electrode and a drain electrode contacting a respective portion of a top surface of the active layer; and
a capping dielectric diffusion barrier liner comprising a capping dielectric metal oxide material and contacting a portion of a top surface of the active layer that overlies the gate electrode, wherein the capping dielectric diffusion barrier liner contacts sidewalls of the gate dielectric, sidewalls of the dielectric diffusion barrier liner, and a top surface of the dielectric diffusion barrier liner.

2. The semiconductor device of claim 1, wherein sidewalls of the gate dielectric, sidewalls of the dielectric diffusion barrier liner, and sidewalls of the active layer are vertically coincident with one another.

3. The semiconductor device of claim 1, wherein the dielectric diffusion barrier liner comprises a material selected from a metal oxide of an alkaline earth metal, a dielectric oxide of a transition metal or aluminum oxide, silicon nitride, and silicon oxide.

4. The semiconductor device of claim 1, wherein each surface of the active layer is in contact with a respective surface selected from a top surface of the dielectric diffusion barrier liner, a surface of the source electrode, a surface of the drain electrode, and surfaces of the capping dielectric diffusion barrier liner.

5. The semiconductor device of claim 1, wherein:
the substrate comprises a single crystalline silicon substrate;
lower-level dielectric layers embedding lower-level metal interconnect structures are located between the single crystalline silicon substrate and the insulating layer; and
field effect transistors including a respective portion of the single crystalline silicon substrate as a channel are embedded within the lower-level dielectric layers, and are electrically connected to at least one of the gate electrode, the source electrode, and the drain electrode.

6. The semiconductor device of claim 1, wherein:
the active layer comprises a compound semiconductor material including at least two metallic elements and oxygen; and
the dielectric diffusion barrier liner comprise an oxide material including at least one metallic element selected from the at least two metallic elements.

7. The semiconductor device of claim 6, wherein:
the active layer comprises an indium-containing semiconducting metal oxide material; and
the dielectric diffusion barrier liner comprises a dielectric material that is free of indium.

8. The semiconductor device of claim 6, wherein:
the active layer comprises indium gallium zinc oxide; and
the dielectric diffusion barrier liner comprises a material selected from gallium oxide, zinc oxide, and gallium zinc oxide.

9. A semiconductor device comprising:
an insulating layer embedding a bottom gate electrode and overlying a substrate;
a first stack of a bottom gate dielectric including a first gate dielectric material, a dielectric diffusion barrier liner including a dielectric diffusion barrier material and overlying the bottom gate dielectric, and an active layer overlying a top surface of the bottom gate electrode, wherein the dielectric diffusion barrier material is different from the first gate dielectric material and is selected from a dielectric metal oxide material and a dielectric compound of silicon;
a second stack of a top gate dielectric and a top gate electrode overlying the bottom gate electrode and having an areal overlap with the bottom gate electrode in a plan view, wherein the top gate electrode contacts a top surface of the top gate dielectric;
a source electrode and a drain electrode contacting a respective portion of a top surface of the active layer; and
a capping dielectric diffusion barrier liner comprising a capping dielectric metal oxide material and contacting a top surface and sidewalls of the active layer and contacting a horizontal bottom surface of a portion of the top gate dielectric that underlies the top gate electrode.

10. The semiconductor device of claim 9, wherein each surface of the active layer is in contact with a respective surface selected from a top surface of the dielectric diffusion barrier liner, a surface of the source electrode, a surface of the drain electrode, and surfaces of the capping dielectric diffusion barrier liner.

11. The semiconductor device of claim 10, further comprising:
a dielectric layer laterally surrounding the stack of the bottom gate dielectric and the active layer; and
a backside electrode contact via structure contacting a top surface of the bottom gate electrode,
wherein top surfaces of the source electrode, the drain electrode, the top gate electrode, and the backside contact via structure are located within a horizontal plane including a top surface of the dielectric layer.

12. The semiconductor structure of claim 10, wherein:
the top gate dielectric is in direct contact with the source electrode and with the drain electrode; and
the capping dielectric diffusion barrier liner is in direct contact with the source electrode and with the drain electrode.

13. The semiconductor structure of claim 9, wherein an entirety of the active layer is located below a horizontal plane including a bottommost surface of the top gate electrode and a top surface of the top gate dielectric.

14. The semiconductor structure of claim 9, wherein:
an entirety of the source electrode is located above a horizontal plane including a topmost surface of the active layer; and an entirety of the drain electrode is located above the horizontal plane including the topmost surface of the active layer.

15. The semiconductor structure of claim 9, wherein a bottom surface of the top gate dielectric is in direct contact with a top surface of the capping dielectric diffusion barrier liner.

16. The semiconductor structure of claim 9, wherein the source electrode is in direct contact with a first horizontal surface segment of the top surface of the active layer and does not contact any surface segment of active layer other than the first horizontal surface segment, and the drain electrode is in direct contact with a second horizontal surface segment of the top surface of the active layer and does not contact any surface segment of the active layer other than the second horizontal surface segment.

17. A method of forming a semiconductor device, comprising:
   forming a gate electrode within an insulating layer that overlies a substrate;
   forming a stack of a gate dielectric including a gate dielectric material, a dielectric diffusion barrier liner including a dielectric diffusion barrier material, and an active layer over the gate electrode and the insulating layer, wherein the dielectric diffusion barrier material is different from the gate dielectric material and is selected from a dielectric metal oxide material and a dielectric compound of silicon;
   forming a source electrode and a drain electrode on end portions of the active layer;
   annealing the dielectric diffusion barrier liner at a first anneal temperature that is higher than 400 degrees Celsius; and
   annealing the active layer at a second anneal temperature that is lower than 350 degrees Celsius.

18. The method of claim 17, further comprising forming a capping dielectric diffusion barrier liner comprising a capping dielectric metal oxide material on a top surface of the active layer, wherein the source electrode and the drain electrode are formed through the capping dielectric diffusion barrier liner directly on the active layer.

19. The method of claim 17, wherein:
   the active layer is formed by deposition and patterning of a compound semiconductor material including at least two metallic elements and oxygen; and
   the dielectric diffusion barrier liner is formed by deposition and patterning of an oxide material including at least one metallic element selected from the at least two metallic elements.

20. The method of claim 19, wherein:
   the active layer comprises an indium-containing semiconducting metal oxide material; and
   the dielectric diffusion barrier liner comprises a dielectric material that is free of indium.

* * * * *